(12) United States Patent
Nagai et al.

(10) Patent No.: US 7,553,400 B2
(45) Date of Patent: Jun. 30, 2009

(54) PLATING APPARATUS AND PLATING METHOD

(75) Inventors: Mizuki Nagai, Tokyo (JP); Hiroyuki Kanda, Tokyo (JP); Keiichi Kurashina, Tokyo (JP); Satoru Yamamoto, Tokyo (JP); Ryoichi Kimizuka, Kanagawa-ken (JP); Hariklia Deligianni, Yorktown Heights, NY (US); Brett Baker, Yorktown Heights, NY (US); Keith Kwietniak, Yorktown Heights, NY (US); Panayotis Andricacos, Yorktown Heights, NY (US); Phillipe Vereecken, Yorktown Heights, NY (US)

(73) Assignees: Ebara Corporation, Tokyo (JP); International Business Machines Corporation (IBM), Armonk, NY (US)

( * ) Notice: Subject to any disclaimer, the term of this patent is extended or adjusted under 35 U.S.C. 154(b) by 371 days.

(21) Appl. No.: 11/016,924

(22) Filed: Dec. 21, 2004

(65) Prior Publication Data

US 2005/0241946 A1    Nov. 3, 2005

(30) Foreign Application Priority Data

Dec. 25, 2003    (JP)    ............................. 2003-431211

(51) Int. Cl.
    *C25D 5/22*    (2006.01)
(52) U.S. Cl. ......................................... 205/93; 205/137
(58) Field of Classification Search ................... 205/93, 205/96, 98, 137, 148, 157
    See application file for complete search history.

(56) References Cited

U.S. PATENT DOCUMENTS

| | | | |
|---|---|---|---|
| 6,176,992 B1 | 1/2001 | Talieh | |
| 6,261,433 B1 * | 7/2001 | Landau | 205/96 |
| 6,402,925 B2 | 6/2002 | Talieh | |
| 6,632,335 B2 | 10/2003 | Matsuda et al. | |
| 6,689,257 B2 | 2/2004 | Mishima et al. | |
| 6,793,796 B2 * | 9/2004 | Reid et al. | 205/102 |
| 6,858,123 B1 * | 2/2005 | Hu et al. | 205/291 |
| 6,913,681 B2 * | 7/2005 | Matsuda et al. | 205/117 |
| 2002/0020627 A1 * | 2/2002 | Kunisawa et al. | 205/96 |
| 2003/0019755 A1 * | 1/2003 | Hey et al. | 205/87 |

* cited by examiner

*Primary Examiner*—Nam X Nguyen
*Assistant Examiner*—Luan V Van
(74) *Attorney, Agent, or Firm*—Wenderoth, Lind & Ponack, L.L.P.

(57) ABSTRACT

A plating method is capable of mechanically and electrochemically preferentially depositing a plated film in fine interconnect recesses such as trenches and via holes, and depositing the plated film to a flatter surface. The plating method including: disposing a substrate having fine interconnect recesses such that a conductive layer faces an anode; disposing a porous member between the substrate and the anode; filling a plating solution between the substrate and the anode; and repeating a process of holding the conductive layer and the porous member in contact with each other and moving the conductive layer and the porous member relatively to each other, a process of passing an electric current between the conductive layer and the anode while keeping the conductive layer still with respect to the porous member, and a process of stopping the supply of the electric current between the conductive layer and the anode.

16 Claims, 26 Drawing Sheets

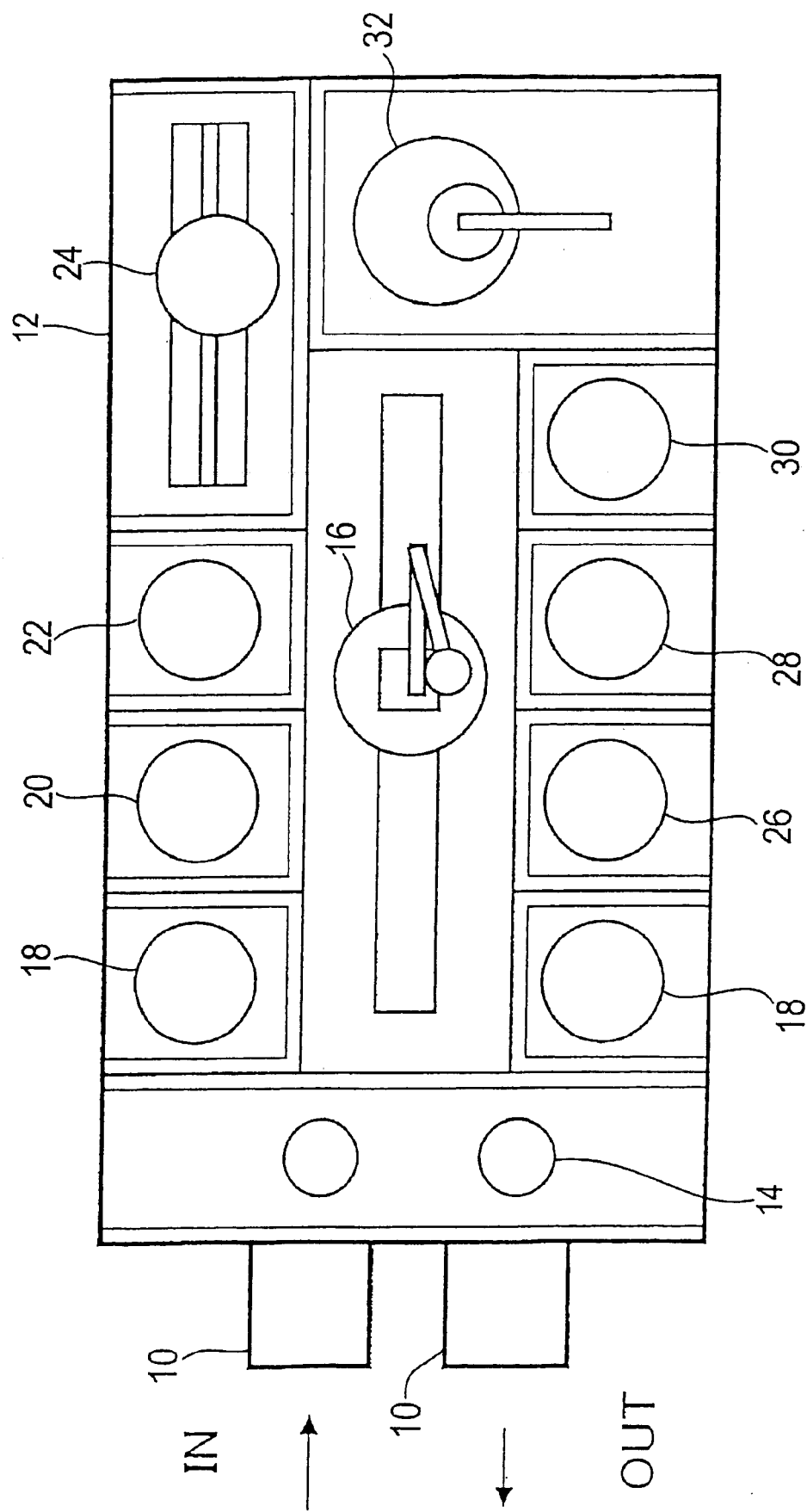

PLATING APPARATUS AND PLATING METHOD

BACKGROUND OF THE INVENTION

1. Field of the Invention

The present invention relates to a plating apparatus and a plating method, and more particularly to a plating apparatus and a plating method used for filling a fine circuit pattern formed in a substrate, such as a semiconductor substrate, with metal (interconnect material) such as copper so as to form interconnects.

2. Description of the Related Art

Recently, there has been employed a circuit forming method comprising forming fine recesses for interconnects, such as trenches or via holes in a circuit form, in a semiconductor substrate, embedding the fine recesses with copper (interconnect material) by copper plating, and removing a copper layer (plated film) at portions other than the fine recesses by CMP or the like. In this damascene method, from the viewpoint of reducing loads on subsequent CMP, it is desirable that a copper plated film be deposited selectively in trenches or via holes in a circuit form, and that the amount of copper plated film deposited on portions other than the trenches or via holes be small. In order to achieve such an object, there have heretofore been proposed various ideas regarding a plating solution, such as composition in a bath of a plating solution or a brightener used in a plating solution.

A plating apparatus having the following configuration has been known as this type of plating apparatus used for plating to form fine interconnects having high aspect ratios. A substrate is held in such a state that a surface (surface to be plated) of the substrate faces upward (in a face-up manner). A cathode electrode is brought into contact with a peripheral portion of the substrate so that the surface of the substrate serves as a cathode. An anode is disposed above the substrate. While a space between the substrate and the anode is filled with a plating solution, a plating voltage is applied between the substrate (cathode) and the anode to plate a surface (surface to be plated) of a substrate (for example, see Japanese laid-open patent publication No. 2002-506489).

In a plating apparatus in which a substrate is held and plated in single wafer processing while a surface of the substrate faces upward, a distribution of a plating current can be made more uniform over an entire surface of the substrate to improve uniformity of a plated film over the surface of the substrate. Generally, the substrate is transferred and subjected to various processes in such a state that a surface of the substrate faces upward. Accordingly, it is not necessary to turn the substrate at the time of plating.

Meanwhile, in order to deposit a copper plated film selectively in trenches in a circuit form or the like, there has been known a method of bringing a porous member into contact with a substrate such as a semiconductor wafer, and plating the substrate while relatively moving the porous member in a contact direction (for example, see Japanese laid-open patent publication No. 2000-232078).

However, in the prior art, when plating is performed, an amount of plated material is different in regions of the surface of the substrate depending on the shape variations (widths or sizes differences) of the interconnect pattern, such as trenches and via holes, under the influence of distribution of current density or the influence of additives, and hence it is difficult to form a plated film having a uniform thickness over the entire surface of the substrate. For example, a plated film deposited on an interconnect section having a dense fine interconnect pattern (trenches) is thicker than a plated film deposited on other portions, and a phenomenon called an over-plating phenomenon generally occurs. On the other hand, an amount of plated material deposited on an interconnect section having a wide interconnect pattern (trenches) is generally smaller than that on other portions. As a result, in a case where an interconnect pattern is filled entirely with interconnect material such as copper by plating, the thickness of a plated film differs depending on the locations, causing irregularities in the plated film surface. When plating is performed according to such method, more amount of plated material than necessary is deposited, and hence raw material cost increases and a longer period of plating time is required. Further, loads on a polishing process such as CMP after plating increase, and in the next generation in which a low-k material is used as an interlevel dielectric layer, a polishing apparatus will require a considerably high performance.

In order to solve the above problems, various ideas or attempts has been proposed regarding a plating solution such as composition in a bath of the plating solution or a brightener used in a plating solution, and improvement of current condition. These ideas or attempts can achieve the object to a certain extent but have a limitation such as a plated film of poor quality.

SUMMARY OF THE INVENTION

The present invention has been made in view of the above situation in the related art. It is therefore an object of the present invention to provide a plating method and a plating apparatus which are capable of mechanically and electro-chemically preferentially depositing a plated film in fine interconnect recesses such as trenches and via holes, and depositing the plated film to a flatter surface without being affected by variations of the shape of the trenches and the via holes.

In order to achieve the above object, the present invention provides a plating method comprising: disposing a substrate having fine interconnect recesses such that a conductive layer formed on a surface of a substrate faces an anode; disposing a porous member between the substrate and the anode; filling a plating solution containing metal ions, a supporting electrolyte, halogen ions, and at least one of an organic sulfur compound, a high polymer compound, and an organic nitrogen compound between the substrate and the anode; and repeating a process of holding the conductive layer and the porous member in contact with each other and moving the conductive layer and the porous member relatively to each other without passing an electric current between the conductive layer and the anode, a process of passing an electric current between the conductive layer and the anode while keeping the conductive layer still with respect to the porous member, and a process of stopping the supply of the electric current between the conductive layer and the anode, thereby embedding metal in the fine interconnect recesses.

As described above, the plating solution containing metal ions, a supporting electrolyte, halogen ions, and at least one of an organic sulfur compound, a high polymer compound, and an organic nitrogen compound is employed, and the process of holding the conductive layer and the porous member in contact with each other and moving the conductive layer and the porous member relatively to each other without passing an electric current between the conductive layer and the anode, and the process of passing an electric current between the conductive layer and the anode while keeping the conductive layer still with respect to the porous member, and the process of stopping the supply of the electric current between the conductive layer and the anode, are repeated to embed metal in the fine interconnect recesses. It has been confirmed that according to the above method, it is possible to preferentially deposit a plated film in fine interconnect recesses such as trenches and via holes, and deposit the plated film to a flatter surface without being affected by variations of the shape (widths or sizes differences) of the trenches, or the via holes, or the like.

In a preferred embodiment of the present invention, the metal ions comprise copper ions, and the copper ions in the plating solution has a concentration ranging from 30 to 60 g/L. This makes it possible to form interconnects made of copper that is highly electrically conductive (copper interconnects).

In a preferred embodiment of the present invention, the supporting electrolyte comprises sulfuric acid, and the sulfuric acid in the plating solution has a concentration ranging from 10 to 100 g/L.

In a preferred embodiment of the present invention, the halogen ions comprise chloride ions, and the chloride ions in the plating solution has a concentration ranging from 30 to 90 mg/L.

Preferably, the organic sulfur compound contained in the plating solution has a concentration ranging from 0.1 to 100 ppm.

The organic sulfur compound may be N,N-dimethyldithiomylpropyl sulfonic acid, O-ethyl-S-(3-propyl sulfonic acid)-dithiocarbonate, bis-(sulfopropyl)disulfide, or the like, or their salts. The organic sulfur compound is preferably added in an amount ranging from 1 to 50 ppm.

In a preferred embodiment of the present invention, the high polymer compound has a propylene oxide group or a propylene oxide group and an ethylene oxide group, and is contained in the plating solution at a concentration ranging from 10 to 500 mg/L.

The high-polymer compound may be polyethers such as polypropylene glycols or their random or block polymers or their derivatives, or polyethers such as poly(oxyethylene oxypropylene)glycols or their random or block polymers or their derivatives. The high-polymer compound is preferably added in an amount ranging from 50 to 300 mg/L.

Preferably, the organic nitrogen compound is contained in the plating solution at a concentration ranging from 0.01 to 100 g/L.

The organic nitrogen compound may be polyalkyleneimine and its derivative, a thiourea derivative such as an N-dye substitution compound or the like, a safranine compound, or an amide. The organic nitrogen compound is preferably added in an amount ranging from 0.1 to 50 mg/L.

In a preferred embodiment of the present invention, the process of passing the electric current between the conductive layer and the anode is performed while the conductive layer is held in contact with the porous member, and after the supply of the electric current between the conductive layer and the anode is stopped, the conductive layer is released from the porous member.

In a preferred embodiment of the present invention, the electric current is passed between the conductive layer and the anode at a current density ranging from 1 to 50 mA/cm$^2$ for a period of time ranging from 0.1 to 100 seconds, and after the supply of the electric current between the conductive layer and the anode is stopped, the conductive layer is released from the porous member for a period of time ranging from 0.1 to 100 seconds.

Preferably, the current density of the electric current, which is passed between the conductive layer and the anode, increases with time.

In a preferred embodiment of the present invention, the process of passing the electric current between the conductive layer and the anode, and the process of stopping the supply of the electric current between the conductive layer the anode are continuously performed while the conductive layer is being released from the porous member.

The present invention provides a plating apparatus comprising: a substrate holding portion for holding a substrate; a cathode portion having a seal member for engaging a peripheral portion of a surface, to be plated, of the substrate held by the substrate holding portion to seal the peripheral portion in a water-tight manner, and a cathode electrode for contacting the substrate to supply an electric current thereto; an electrode head vertically movably disposed above the cathode portion, and having an upper anode and a lower water retaining porous member; plating solution introducing portion for introducing a plating solution containing metal ions, a supporting electrolyte, halogen ions, and at least one of an organic sulfur compound, a high polymer compound, and an organic nitrogen compound, between the anode and the surface, to be plated, of the substrate held by the substrate holding portion; a pressing/releasing mechanism for pressing the porous member under pressure against the surface, to be plated, of the substrate held by the substrate holding portion, and for releasing the porous member from the surface, to be plated, of the substrate; a power source for applying a plating voltage between the cathode electrode and the anode; and a controller for controlling the pressing/releasing mechanism and the power source.

The plating apparatus may further comprise a drive mechanism for rotating at least one of the porous member and the substrate holding portion about its own axis and/or another axis.

The plating apparatus may further comprise a drive mechanism for vertically moving and/or vibrating at least one of the porous member and the substrate holding portion.

BRIEF DESCRIPTION OF THE DRAWINGS

FIG. 2 is a plan view of a substrate processing apparatus having a plating apparatus according to an embodiment of the present invention;

DETAILED DESCRIPTION OF THE PREFERRED EMBODIMENTS

A plating apparatus and a plating method according to embodiments of the present invention will be described below with reference to the drawings. The following embodiments show examples in which copper as an interconnect material is embedded in fine recesses for interconnects formed in a surface of a substrate, such as a semiconductor wafer, so as to form interconnects composed of a copper layer. However, it should be noted that other kinds of interconnect materials may be used instead of copper.

Figure 1A:
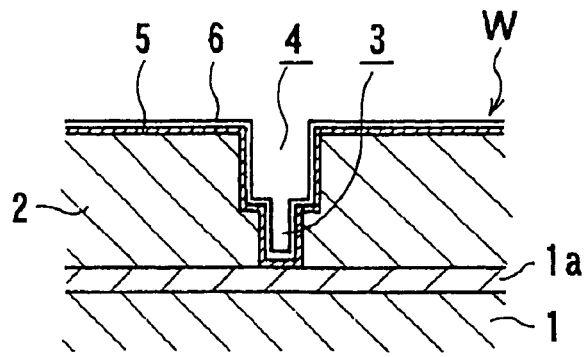
FIG. 1A through 1D are views showing an example for forming interconnects in the semiconductor device in a sequence of steps.

FIGS. 1A through 1D illustrate an example of forming copper interconnects in a semiconductor device. As shown in FIG. 1A, an insulating film 2, such as an oxide film of $SiO_2$ or a film of low-k material, is deposited on a conductive layer 1a formed on a semiconductor base 1 having formed semiconductor devices. Via holes 3 and trenches 4 are formed in the insulating film 2 by performing a lithography/etching technique so as to provide fine recesses for interconnects. Thereafter, a barrier layer 5 of TaN or the like is formed on the insulating film 2, and a seed layer 6 as a feeding layer for electroplating is formed on the barrier layer 5 by sputtering or the like.

Figure 1B:
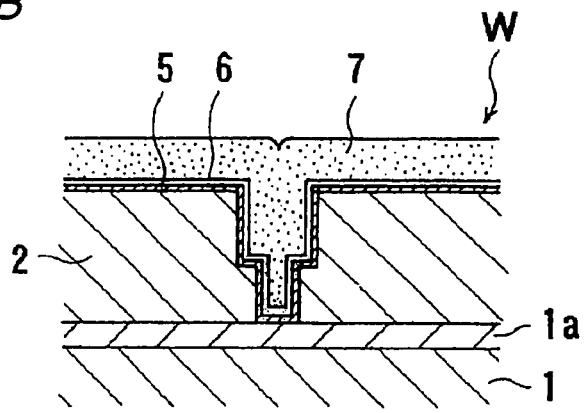
Figure 1C:
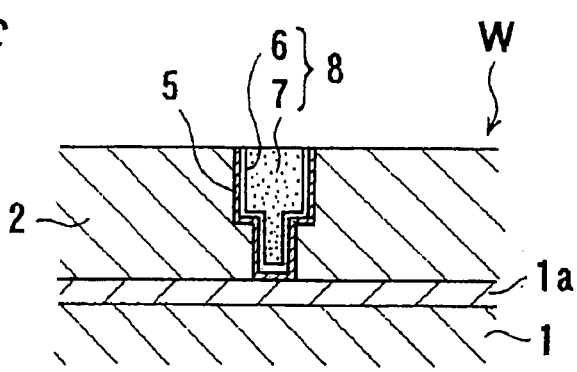

Then, as shown in FIG. 1B, copper plating is performed on a surface of a substrate W to fill the via holes 3 and the trenches 4 with copper and, at the same time, deposit a copper layer 7 on the insulating film 2. Thereafter, the barrier layer 5, the seed layer 6 and the copper layer 7 on the insulating film 2 are removed by chemical mechanical polishing (CMP) or the like so as to leave copper filled in the via holes 3 and the trenches 4, and have a surface of the insulating film 2 lie substantially on the same plane as this copper. Interconnects (copper interconnects) 8 composed of the seed layer 6 and the copper layer 7 are thus formed in the insulating film 2, as shown in FIG. 1C.

Figure 1D:
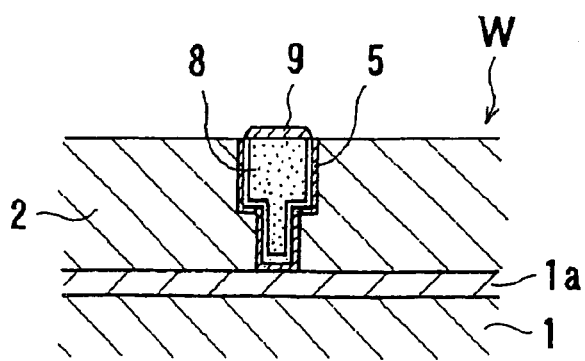

Then, as shown in FIG. 1D, electroless plating is performed on a surface of the substrate W to selectively form a protective film 9 of a Co alloy, an Ni alloy, or the like on surfaces of the interconnects 8, thereby covering and protecting the exposed surfaces of the interconnects 8 with the protective film 9.

FIG. 2 is a plan view of a substrate processing apparatus incorporating a plating apparatus according to an embodiment of the present invention. As shown in FIG. 2, the substrate processing apparatus comprises a rectangular apparatus frame 12 to which transfer boxes 10 such as SMIF (Standard Mechanical Interface) boxes, which accommodate a number of substrates such as semiconductor wafers, are removably attached. Inside of the apparatus frame 12, there are disposed a loading/unloading station 14, and a movable transfer robot 16 for transferring a substrate to and from the loading/unloading station 14. A pair of plating apparatuses 18 is disposed on both sides of the transfer robot 16. A cleaning and drying apparatus 20, a bevel etching and backside cleaning apparatus 22, and a film thickness measuring instrument 24 are disposed in alignment with each other on one side of the transfer robot 16. On another side of the transfer robot 16, a heat treatment (annealing) apparatus 26, a pretreatment apparatus 28, an electroless plating apparatus 30, and a polishing apparatus 32 are disposed in alignment with each other.

The apparatus frame 12 is shielded so as not to allow a light to transmit therethrough, thereby enabling subsequent processes to be performed under a light-shielded condition in the apparatus frame 12. Specifically, the subsequent processes can be performed without irradiating the interconnects with a light such as an illuminating light. By thus preventing the interconnects from being irradiated with a light, it is possible to prevent the interconnects of copper from being corroded due to a potential difference of light that is caused by application of light to the interconnects composed of copper, for example.

Figure 3:
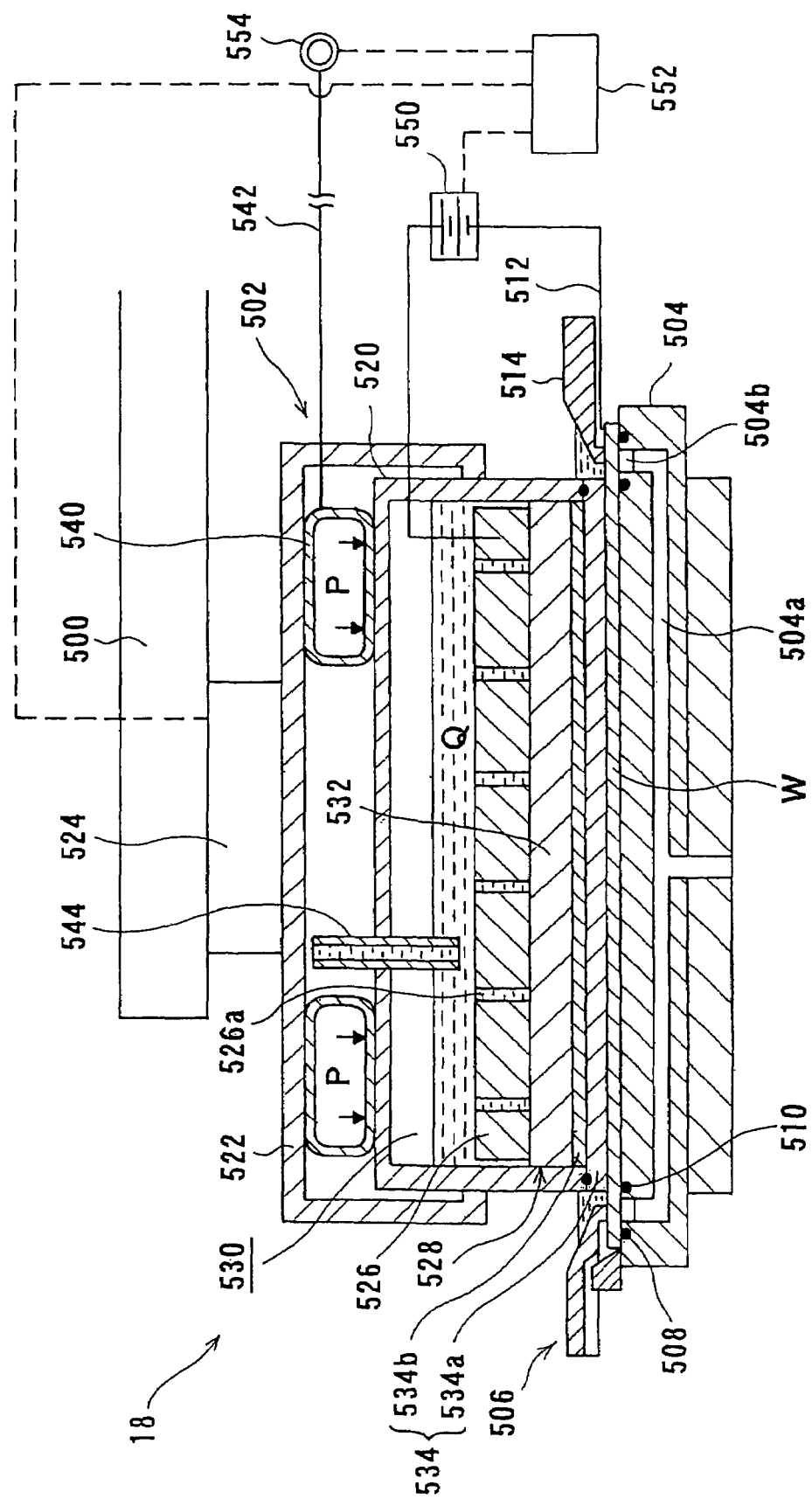
FIG. 3 is a schematic view showing an essential part of the plating apparatus shown in FIG. 2.

FIG. 3 schematically shows the plating apparatus 18. As shown in FIG. 3, the plating apparatus 18 comprises a swing arm 500 which is horizontally swingable. An electrode head 502 is rotatably supported at a tip end portion of the swing arm 500. A substrate holding portion 504 for holding a substrate W in such a state that a surface, to be plated, of the substrate W faces upwardly is vertically movably disposed below the electrode head 502. A cathode portion 506 is disposed above the substrate holding portion 504 so as to surround a peripheral portion of the substrate holding portion 504.

In this embodiment, the electrode head 502 whose diameter is slightly smaller than that of the substrate holding portion 504 is used so that plating can be performed over the substantially entire surface, to be plated, of the substrate W held by the substrate holding portion 504, without changing a relative position between the electrode head 502 and the substrate holding portion 504. In this embodiment, the present invention is applied to a so-called face-up type plating apparatus in which the substrate is held and plated in such a state that the front face of the substrate faces upwardly. However, the present invention is applicable to a so-called face-down type plating apparatus in which the substrate is held and plated in such a state that a front face of the substrate faces downwardly, or a so-called vertical-set type plating apparatus in which the substrate is held in a vertical direction and plated.

An annular vacuum attraction groove 504b communicating with a vacuum passage 504a provided in the substrate holding portion 504 is formed in a peripheral portion of an upper surface of the substrate holding portion 504. Seal rings 508 and 510 are provided on inward and outward sides of the vacuum attraction groove 504b, respectively. With the above structure, the substrate W is placed on the upper surface of the substrate holding portion 504, and the vacuum attraction groove 504b is evacuated through the vacuum passage 504a to attract the peripheral portion of the substrate W, thereby holding the substrate W.

An elevating/lowering motor (not shown) comprising a servomotor and a ball screw (not shown) are used to move the swing arm 500 vertically, and a swinging motor (not shown) is used to rotate (swing) the swing arm 500. Alternatively, a pneumatic actuator may be used instead of the motor.

In this embodiment, the cathode portion 506 has the cathode electrodes 512 comprising six cathode electrodes, and the annular seal member 514 disposed above the cathode electrodes 512 so as to cover upper surfaces of the cathode electrodes 512. The seal member 514 has an inner circumferential portion which is inclined inwardly and downwardly so that a thickness of the seal member 514 is gradually reduced. The seal member 514 has an inner circumferential edge portion extending downwardly. With this structure, when the substrate holding portion 504 is moved upwardly, the peripheral portion of the substrate W held by the substrate holding portion 504 is pressed against the cathode electrodes 512, thus flowing current to the substrate W. At the same time, the inner circumferential edge portion of the seal member 514 is held in close contact with the upper surface of the peripheral portion of the substrate W to seal a contact portion in a water-tight manner. Accordingly, a plating solution that has been supplied onto the upper surface (surface to be plated) of the substrate W is prevented from leaking from the end portion of the substrate W, and the cathode electrodes 512 are thus prevented from being contaminated by the plating solution.

In this embodiment, the cathode portion 506 is not movable vertically, but is rotatable together with the substrate holding portion 504. However, the cathode portion 506 may be designed to be movable vertically so that the seal member 514 is brought into close contact with the surface, to be plated, of the substrate W when the cathode portion 506 is moved downwardly.

The above-mentioned electrode head 502 comprises a rotatable housing 522 and a vertically movable housing 520 which have a bottomed cylindrical shape with a downwardly open end and are disposed concentrically. The rotatable housing 522 is fixed to a lower surface of a rotating member 524 attached to a free end of the swing arm 500 so that the rotatable housing 522 is rotated together with the rotating member 524. An upper portion of the vertically movable housing 520 is positioned inside the rotatable housing 522, and the vertically movable housing 520 is rotated together with the rotatable housing 522 and is moved relative to the rotatable housing 522 in a vertical direction. The vertically movable housing 520 defines an anode chamber 530 by closing the lower open end of the vertically movable housing 520 with a porous member 528 so that a disk-shaped anode 526 is disposed in the anode chamber 530 and is immersed in a plating solution Q which is introduced to the anode chamber 530.

In this embodiment, the porous member 528 has a multi-layered structure comprising three-layer laminated porous materials. Specifically, the porous member 528 comprises a plating solution impregnated material 532 serving to hold a plating solution mainly, and a porous pad 534 attached to a lower surface of the plating solution impregnated material 532. This porous pad 534 comprises a lower pad 534a adapted to be brought into direct contact with the substrate W, and an upper pad 534b disposed between the lower pad 534a and the plating solution impregnated material 532. The plating solution impregnated material 532 and the upper pad 534b are positioned in the vertically movable housing 520, and the lower open end of the vertically movable housing 520 is closed by the lower pad 534a.

As described above, since the porous member 528 has a multi-layered structure, it is possible to use the porous pad 534 (the lower pad 534a) which contacts the substrate W, for example, and has flatness enough to flatten irregularities on the surface, to be plated, of the substrate W. The lower pad 534a is required to have the contact surface adapted to contact the surface (surface to be contacted) of the substrate W and having a certain degree of flatness, and to have fine through-holes therein for allowing the plating solution to pass therethrough. It is also necessary that at least the contact surface of the lower pad 534a is made of an insulator or a material having high insulating properties. The surface of the lower pad 534a is required to have a flatness having a maximum roughness ($R_{max}$) of about several tens μm or less.

It is desirable that the fine through-holes of the lower pad 534a have a circular cross-section in order to maintain flatness of the contact surface. An optimum diameter of each of the fine through-holes and the optimum number of the fine through-holes per unit area vary depending on film properties to be plated and an interconnect pattern. However, it is desirable that both the diameter and the number are as small as possible in view of improving selectivity of a plated film which is growing in a recess. Specifically, the diameter of each of the fine through-holes may be not more than 30 μm, preferably in the range of 5 to 20 μm. The number of the fine through-holes having such diameter per unit area may be represented by a porosity of not more than 50%.

Further, it is desirable that the lower pad 534a has a certain degree of hardness. For example, the lower pad 534a may have a tensile strength ranging from 5 to 100 kg/cm$^2$ and a bend elastic strength ranging from 200 to 10000 kg/cm$^2$.

Furthermore, it is desirable that the lower pad 534a is made of hydrophilic material. For example, the following materials may be used after being subjected to hydrophilization or being introduced with a hydrophilic group by polymerization. Examples of such materials include porous polyethylene (PE), porous polypropylene (PP), porous polyamide, porous polycarbonate, and porous polyimide. The porous PE, the porous PP, the porous polyamide, and the like are produced by using fine powder of ultrahigh-molecular polyethylene, polypropylene, and polyamide, or the like as a material, squeezing the fine powder, and sintering and forming the squeezed fine powder. These materials are commercially available. For example, "Furudasu S (tradename)" manufactured by Mitsubishi Plastics, Inc, "Sunfine UH (trade name)", "Sunfine AQ (trade name)", both of which are manufactured by Asahi Kasei Corporation, and "Spacy (trade name)" manufactured by Spacy Chemical Corporation are available on the market. The porous polycarbonate may be produced by passing a high-energy heavy metal such as copper, which has been accelerated by an accelerator, through a polycarbonate film to form straight tracks, and then selectively etching the tracks.

The lower pad 534a may be produced by a flattening process in which the surface, to be brought into contact with the surface of the substrate W, of the lower pad 534a is compacted or machined to a flat finish for thereby enabling a high-preferential deposition in the fine recesses.

On the other hand, the plating solution impregnated material 532 may be composed of porous ceramics such as alumina, SiC, mullite, zirconia, titania or cordierite, or a hard porous member such as a sintered compact of polypropylene or polyethylene, or a composite material comprising these materials. The plating solution impregnated material 532 may be composed of a woven fiber or non-woven fiber. In case of the alumina-based ceramics, for example, the ceramics with a pore diameter of 30 to 200 μm is used. In case of the SiC, SiC with a pore diameter of not more than 30 μm, a porosity of 20 to 95%, and a thickness of about 1 to 20 mm, preferably 5 to 20 mm, more preferably 8 to 15 mm, is used. The plating solution impregnated material 532, in this embodiment, is composed of porous ceramics of alumina having a porosity of 30%, and an average pore diameter of 100 μm. The porous ceramic plate per se is an insulator, but is constructed so as to have a smaller electrical conductivity than the plating solution by causing the plating solution to enter its inner part complicatedly and follow a considerably long path in the thickness direction.

In this manner, the plating solution impregnated material 532 is disposed in the anode chamber 530, and generates high resistance. Hence, the influence of the resistance of the seed layer 6 (see FIG. 1) becomes a negligible degree. Consequently, the difference in current density over the surface of the substrate due to electrical resistance on the surface of the substrate W becomes small, and the uniformity of the plated film over the surface of the substrate improves.

The electrode head 502 has a pressing/releasing mechanism comprising an air bag 540, in this embodiment, for pressing the lower pad 534a against the surface (surface to be plated) of the substrate W held by the substrate holding portion 504 under a desired pressure, and releasing the lower pad 534a from the surface of the substrate W. Specifically, in this embodiment, a ring-shaped air bag (pressing/releasing mechanism) 540 is provided between the lower surface of the top wall of the rotatable housing 522 and the upper surface of the top wall of the vertically movable housing 520, and this air bag 540 is connected to a pressurized fluid source 554 through a fluid introduction pipe 542.

Thus, the swing arm 500 is fixed at a predetermined position (process position) so as not to move vertically, and then the inner part of the air bag 540 is pressurized under a pressure of P, whereby the lower pad 534a is uniformly pressed against the surface (surface to be plated) of the substrate W held by the substrate holding portion 504 under a desired pressure. Thereafter, the pressure P is restored to an atmospheric pressure, whereby pressing of the lower pad 534a against the substrate W is released to separate the lower pad 534a from the surface of the substrate.

A plating solution introduction pipe 544 is attached to the vertically movable housing 520 to introduce the plating solution into the vertically movable housing 520, and a pressurized fluid introduction pipe (not shown) is attached to the vertically movable housing 520 to introduce a pressurized fluid into the vertically movable housing 520. A number of pores 526a are formed within the anode 526. Thus, a plating solution Q is introduced from the plating solution introduction pipe 544 into the anode chamber 530, and the inner part of the anode chamber 530 is pressurized, whereby the plating solution Q reaches the upper surface of the plating solution impregnated material 532 through the pores 526a of the anode 526, and reaches the upper surface of the substrate W held by the substrate holding portion 504 through the inner part of the plating solution impregnated material 532 and inner part of the porous pad 534 (the upper pad 534b and the lower pad 534a).

The anode chamber 530 includes gases generated by chemical reaction therein, and hence the pressure in the anode chamber 530 may be varied. Therefore, the pressure in the anode chamber 530 is controlled to a certain set value by a feedback control in the process.

For example, in the case of performing copper plating, in order to suppress slime formation, the anode 526 is made of copper (phosphorus-containing copper) containing 0.03 to 0.05% of phosphorus. The anode 526 may comprise an insoluble metal such as platinum or titanium, or an insoluble electrode comprising metal on which platinum, iridium oxide or the like is coated or plated. Since replacement or the like is unnecessary, the insoluble metal or the insoluble electrode is preferable. Further, the anode 526 may be a net-like anode which allows a plating solution to pass therethrough easily.

The cathode electrodes 512 are electrically connected to a cathode of a plating power source 550, and the anode 526 is electrically connected to an anode of the plating power source 550. The plating power source 550, the pressurized fluid source 554 for supplying a pressurized fluid to the air bag 540 as a pressing/releasing mechanism, and the rotating member 524 for rotating the rotatable housing 522 and the vertically movable housing 520 in unison with each other are controlled by control signals outputted from a controller 552.

In this embodiment, the plating solution Q contains copper ions as metal ions, a supporting electrolyte and halogen ions, and at least one of an organic sulfur compound, a high-polymer compound, and an organic nitrogen compound.

The concentration of the copper ions in the plating solution Q is preferably in the range from 30 to 60 g/L. The supporting electrolyte is preferably sulfuric acid. If the supporting electrolyte is sulfuric acid, then the concentration of the sulfuric acid in the plating solution Q is preferably in the range from 10 to 100 g/L. The halogen ions are preferably chloride ions. If the halogen ions are chloride ions, then the concentration of the chloride ions in the plating solution Q preferably in the range from 30 to 90 mg/L.

The organic sulfur compound may be N,N-dimethyldithiomylpropyl sulfonic acid, O-ethyl-S-(3-propyl sulfonic acid)-dithiocarbonate, bis-(sulfopropyl)disulfide, or the like, or their salts. The organic sulfur compound is added generally in an amount ranging from 0.1 to 100 ppm, and preferably in an amount ranging from 1 to 50 ppm.

The high-polymer compound has preferably a propylene oxide group or a propylene oxide group, and an ethylene oxide group. The high-polymer compound of this type may be polyethers such as polypropylene glycols or their random or block polymers or their derivatives, or polyethers such as poly (oxyethylene-oxypropylene) glycols or their random or block polymers or their derivatives. The high-polymer compound is added generally in an amount ranging from 10 to 500 mg/L, and preferably in an amount ranging from 50 to 300 mg/L.

The organic nitrogen compound may be polyalkyleneimine and its derivative, a thiourea derivative such as an N-dye substitution compound or the like, a safranine compound, or an amide. The organic nitrogen compound is added generally in an amount ranging from 0.01 to 100 mg/L, and preferably in an amount ranging from 0.1 to 50 mg/L.

Next, operation for conducting plating by the plating apparatus will be described. First, in such a state that the substrate W is attracted to and held by the upper surface of the substrate holding portion 504, the substrate holding portion 504 is raised to bring the peripheral portion of the surface, to be plated, of the substrate W, which has been formed the seed layer (conductive layer) 6 shown in FIG. 1A, for example, into contact with the cathode electrodes 512, thus making it possible to supply current to the substrate W. Further, the substrate holding portion 504 is raised to press the seal member 514 against the upper surface of the peripheral portion of the surface, to be plated, of the substrate W, thereby sealing the peripheral portion of the surface, to be plated, of the substrate W in a watertight manner.

On the other hand, the electrode head 502 is moved from a position (idling position) where replacement of the plating solution, removal of bubbles, and the like are conducted by idling to a predetermined position (process position) in such a state that the plating solution Q is held inside the electrode head 502. Specifically, the swing arm 500 is once raised and further swung, whereby the electrode head 502 is located right above the substrate holding portion 504. Thereafter, the electrode head 502 is lowered, and when the electrode head 502 reaches the predetermined position (process position), the electrode head 502 is stopped. Then, the anode chamber 530 is pressurized, and the plating solution Q held by the electrode head 502 is discharged from the lower surface of the porous pad 534 to fill the space between the substrate W and the porous pad 534 with plating solution. Next, the lower pad 534a is pressed downwardly by introducing a pressurized air into the air bag 540 to press the lower pad 534a against the upper surface (surface to be plated) of the substrate W held by the substrate holding portion 504 under a desired pressure.

In such a state that the lower pad 534a is brought into contact with the surface of the substrate W, the surface (lower surface) of the lower pad 534a is rubbed against the surface of the substrate W by making two revolutions of the substrate W held by the substrate holding portion 504 at a speed of 1 revolution/second, for example, and then rotation of the substrate W is stopped. In this manner, the surface (upper surface) of the substrate W is intimately held against the lower pad 534a. Alternatively, the substrate W may be fixed and the lower pad W may be rotated with respect to the substrate W. After the rotation of the substrate W is stopped, the cathode electrodes 512 are connected to the cathode of the plating power source 550 and the anode 526 is connected to the anode of the plating power source 550 preferably within 2 seconds, passing an electric current at a current density ranging from 1 to 50 mA/cm$^2$, for example, between the surface to be plated (seed layer 6) of the substrate W and the anode 526, thereby to plate the surface to be plated (the surface of the seed layer 6) of the substrate W.

As described above, the lower pad 534a of the porous member 528 and the surface, to be plated, of the substrate W that is held by the substrate holding portion 504 are held in contact with each other, and the lower pad 534a and the substrate W are moved relatively to each other. Thereafter, electroplating is performed onto the substrate W using the plating solution Q which contains copper ions as metal ions, a supporting electrolyte and halogen ions, and at least one of an organic sulfur compound, a high-polymer compound, and an organic nitrogen compound. The deposition of a plated film on the upper portion of the interconnect pattern is suppressed to lower the plating rate, and the plated film is preferentially deposited in the trenches 4 and the via holes 3 (see FIG. 1B).

After the electroplating is continued for a predetermined period of time, e.g., ranging from 0.1 to 100 seconds, the cathode electrodes 512 and the anode 526 are disconnected from the plating power source 550, and the atmospheric pressure is introduced again into the air bag 540 to release the lower pad 534a from the plated surface of the substrate W. The electrode head 502 is left to stand for a predetermined period of time, e.g., ranging from 0.1 to 100 seconds.

The above process, i.e., the lower pad 534a is brought into contact with the surface of the substrate W, then the lower pad 534a and the substrate W are moved relatively to each other, and after the relative movement is stopped, the cathode electrodes 512 are connected to the cathode of the plating power source 550 and the anode 526 is connected to the anode of the plating power source 550 to plate the substrate W for a predetermined period of time, after which the cathode electrodes 512 and the anode 526 are disconnected from the plating power source 550, and the lower pad 534a is released from the plated surface of the substrate W, and the electrode head 502 is left to stand for a predetermined period of time, is performed as one cycle. The above cycle is repeated a predetermined number of times, e.g., 15 times. After a copper layer 7 (see FIG. 1B) having a sufficient film thickness to embed the fine interconnect recesses is deposited on the surface (surface to be plated) of the substrate W, the electrode head 502 is turned back to the original position (idling position).

Another process, i.e., the lower pad 534a is brought into contact with the surface of the substrate W, then the lower pad 534a and the substrate W are moved relatively to each other, and after the relative movement is stopped, the lower pad 534a is released from the plated surface of the substrate W, and the cathode electrodes 512 are connected to the cathode of the plating power source 550 and the anode 526 is connected to the anode of the plating power source 550 to plate the substrate W for a predetermined period of time (non-contact plating), after which the cathode electrodes 512 and the anode 526 are disconnected from the plating power source 550, and the electrode head 502 is left to stand for a predetermined period of time, may be performed as one cycle. The above cycle may be repeated a predetermined number of times, e.g., 15 times.

As described above, the plating solution Q containing copper ions as metal ions, a supporting electrolyte and halogen ions, and at least one of an organic sulfur compound, a high-polymer compound, and an organic nitrogen compound is employed, and the process of holding the surface (conductive layer) of the substrate in contact with the lower pad (porous member) 534a and passing an electric current between the surface of the substrate and the anode 526, and the process of stopping the supply of the electric current between the surface of the substrate and the anode 526 and releasing the substrate from the lower pad (porous member) 534a are repeated to embed the metal in the fine interconnect recesses. In this manner, the plated film is preferentially deposited in the fine interconnect recesses such as trenches and via holes. The plated film can be deposited to a flatter surface without being affected by variations of the shape (widths or sizes differences) of the trenches or the via holes, or the like.

If the above cycle is repeated 12 times, for example, then the current density of the electric current that is passed between the surface to be plated (seed layer 6) of the substrate W and the anode 526 may be set to 10 mA/cm$^2$ for the first six cycles and to 20 mA/cm$^2$ for the last six cycles. In this manner, the current density may be increased with time.

In this embodiment, the substrate holding portion 504 is rotated to move the substrate W held by the substrate holding portion 504 and the lower pad 534a relatively to each other. However, one of the lower pad 534a and the substrate W held by the substrate holding portion 504 may be rotated about another axis. Furthermore, one of the lower pad 534a and the substrate W held by the substrate holding portion 504 may be vertically moved and/or vibrated.

Figure 4:
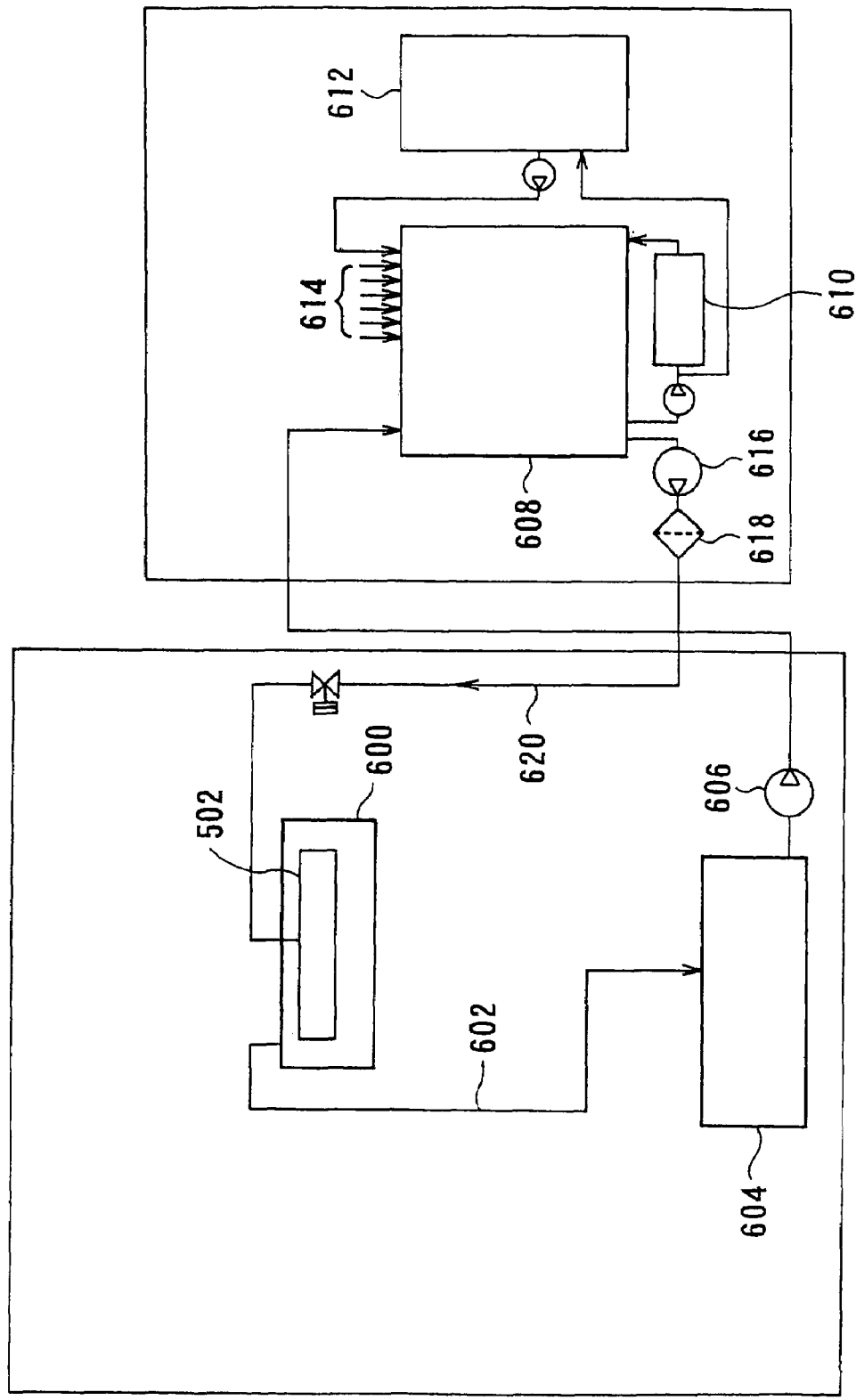
FIG. 4 is a systematic diagram showing an example of a plating solution management and supply system.

FIG. 4 shows a plating solution management and supply system for supplying a plating solution whose composition, temperature, and the like are controlled to the plating apparatus 18. As shown in FIG. 4, a plating solution tray 600 for allowing the electrode head 502 of the plating apparatus 18 to be immersed for idling is provided, and the plating solution tray 600 is connected to a reservoir 604 through a plating solution discharge pipe 602. The plating solution discharged through the plating solution discharge pipe 602 flows into the reservoir 604.

The plating solution, which has flowed into the reservoir 604, is introduced into the plating solution regulating tank 608 by operating a pump 606. This plating solution regulating tank 608 is provided with a temperature controller 610, and a plating solution analyzing unit 612 for sampling the plating solution and analyzing the sample solution. Further, component replenishing pipes 614 for replenishing the plating solution with components which are found to be insufficient by an analysis performed by the plating solution analyzing unit 612 are connected to the plating solution regulating tank 608. When a pump 616 is operated, the plating solution in the plating solution regulating tank 608 flows in a plating solution supply pipe 620, passes through a filter 618, and is then returned to the plating solution tray 600.

In this manner, the composition and temperature of the plating solution is adjusted to be constant in the plating solution regulating tank 608, and the adjusted plating solution is supplied to the electrode head 502 of the plating apparatus 18. Then, by holding the adjusted plating solution by the electrode head 502, the plating solution having constant composition and temperature at all times can be supplied to the electrode head 502 of the plating apparatus 18.

Figure 5:
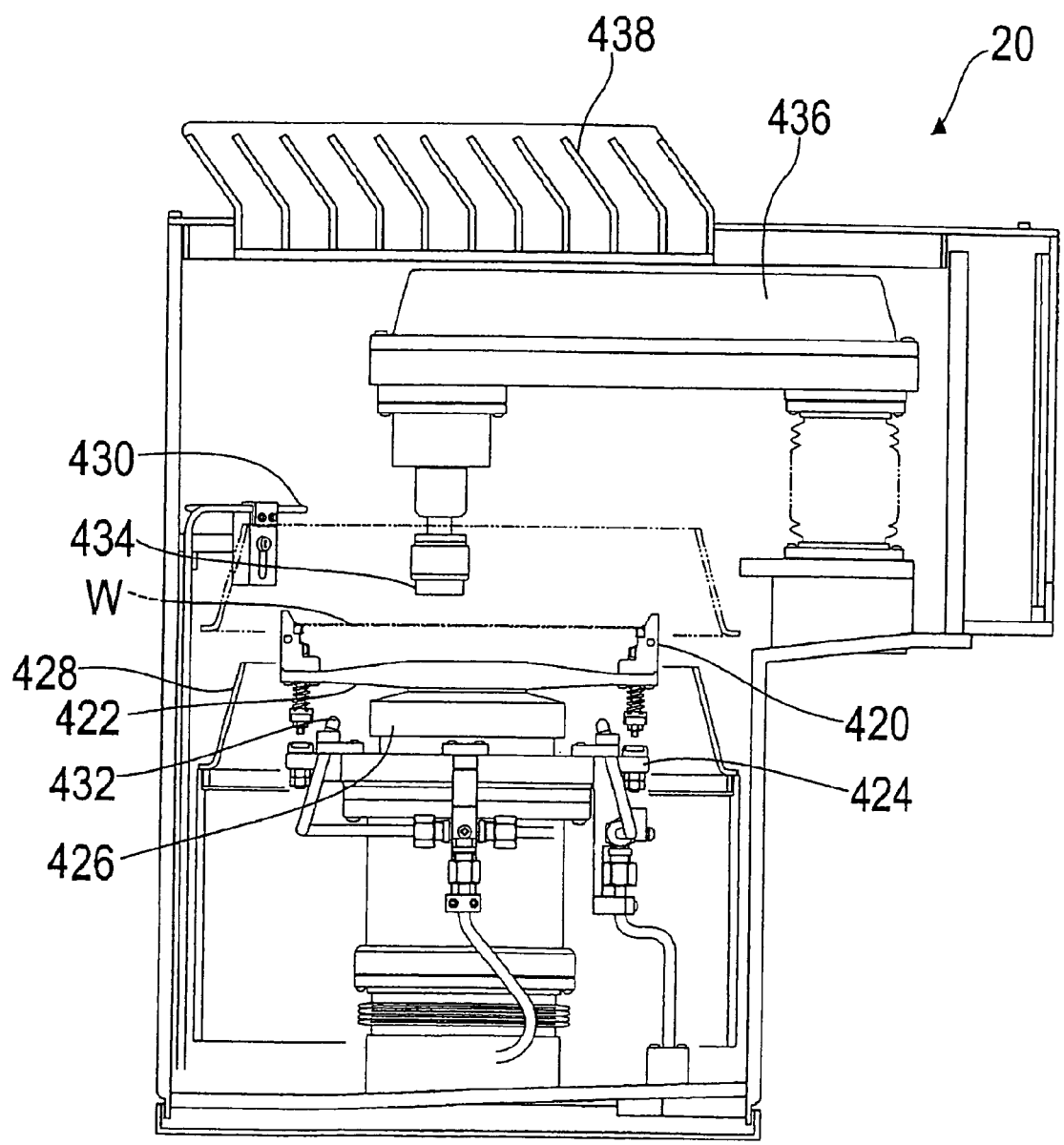
FIG. 5 is a front cross-sectional view showing an example of a cleaning and drying apparatus shown in FIG. 2.
Figure 6:
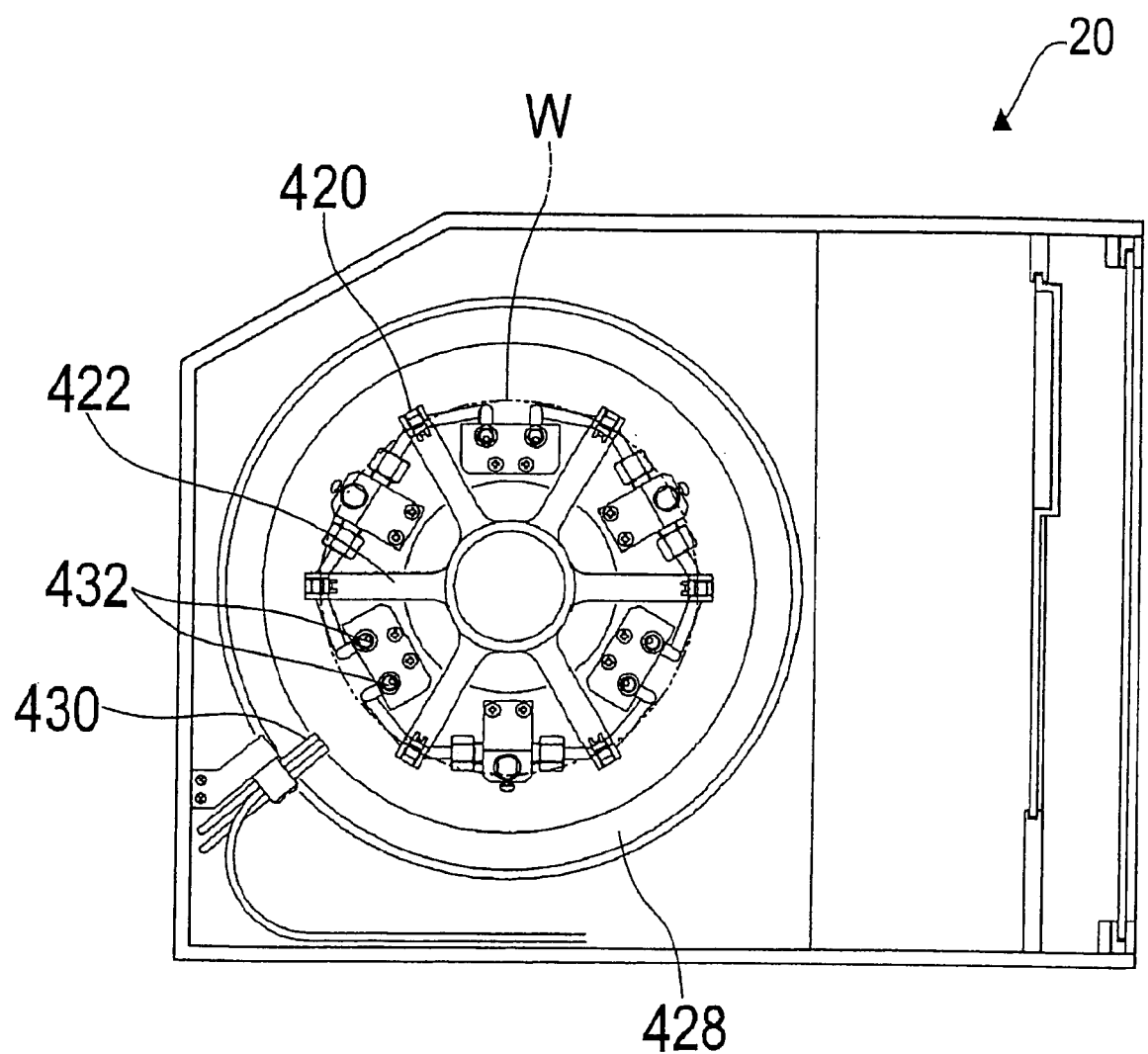
FIG. 6 is a plan view showing an example of the cleaning and drying apparatus shown in FIG. 2.

FIGS. 5 and 6 show an example of a cleaning and drying apparatus 20 for cleaning (rinsing) the substrate W and drying the substrate W. Specifically, the cleaning and drying apparatus 20 performs chemical cleaning and pure water cleaning (rinsing) first, and then completely drying the substrate W which has been cleaned by spindle rotation. The cleaning and drying apparatus 20 comprises a substrate stage 422 having a clamp mechanism 420 for clamping an edge portion of the substrate W, and a substrate mounting and removing lifting/lowering plate 424 for opening and closing the clamp mechanism 420.

The substrate stage 422 is coupled to an upper end of a spindle 426 which is rotated at a high speed by the actuation of a spindle rotating motor (not shown). Further, a cleaning cup 428 for preventing a treatment liquid from being scattered around is disposed around the substrate W held by the clamp mechanism 420, and the cleaning cup 428 is vertically moved by actuation of a cylinder (not shown).

Further, the cleaning and drying apparatus 20 comprises a chemical liquid nozzle 430 for supplying a treatment liquid to the surface of the substrate W held by the clamp mechanism 420, a plurality of pure water nozzles 432 for supplying pure water to the backside surface of the substrate W, and a pencil-type cleaning sponge 434 which is disposed above the substrate W held by the clamp mechanism 420 and is rotatable. The pencil-type cleaning sponge 434 is attached to a free end of a swing arm 436 which is swingable in a horizontal direction. Clean air introduction ports 438 for introducing clean air into the apparatus are provided at the upper part of the cleaning and drying apparatus 20.

With the cleaning and drying apparatus 20 having the above structure, the substrate W is held by the clamp mechanism 420 and is rotated by the clamp mechanism 420, and while the swing arm 436 is swung, a treatment liquid is supplied from the chemical liquid nozzle 430 to the cleaning sponge 434, and the surface of the substrate W is rubbed with the pencil-type cleaning sponge 434, thereby cleaning the surface of the substrate W. Further, pure water is supplied to the backside surface of the substrate W from the pure water nozzles 432, and the backside surface of the substrate W is simultaneously cleaned (rinsed) by the pure water ejected from the pure water nozzles 432. Thus cleaned substrate W is spin-dried by rotating the spindle 426 at a high speed.

Figure 7:
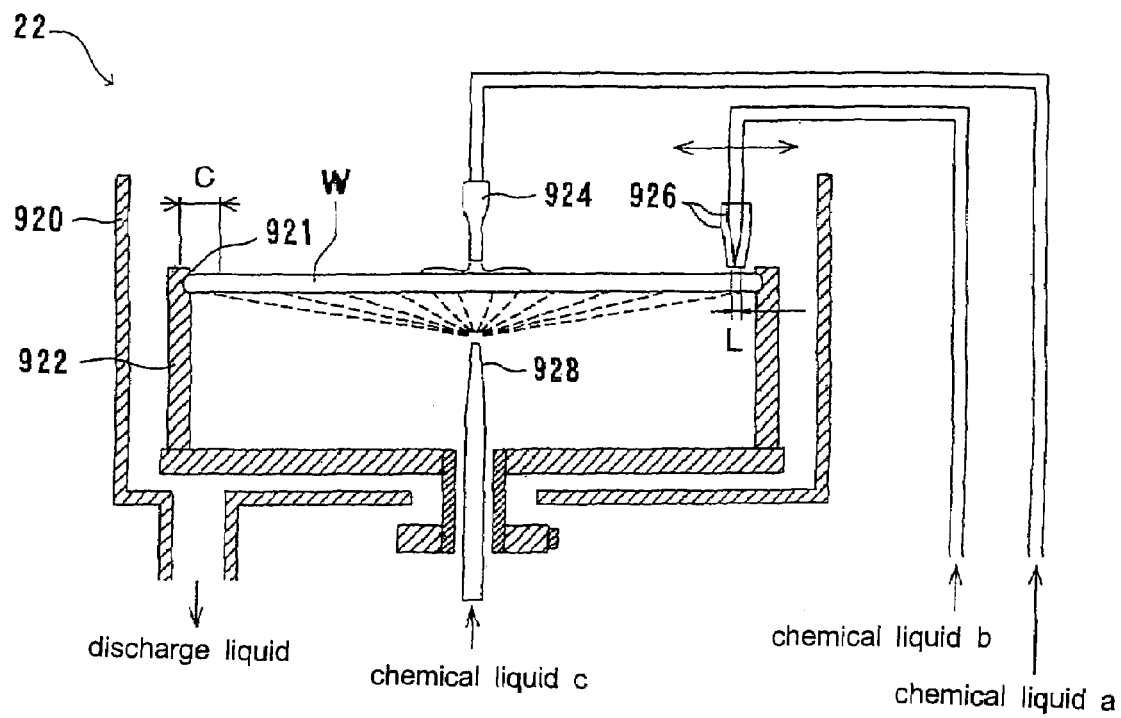
FIG. 7 is a schematic view showing an example of a bevel etching and backside cleaning apparatus shown in FIG. 2.

FIG. 7 shows an example of a bevel etching and backside cleaning apparatus 22. The bevel etching and backside cleaning apparatus 22 can perform etching of the copper layer 7 (see FIG. 1B) deposited on an edge (bevel) portion of the substrate and backside cleaning simultaneously, and can suppress growth of a natural oxide film of copper at a circuit-formed portion on the surface of the substrate. The bevel etching and backside cleaning apparatus 22 has a substrate stage 922 positioned inside a bottomed cylindrical waterproof cover 920 and adapted to rotate the substrate W at a high speed, in such a state that the face of the substrate W faces upward, while holding the substrate W horizontally by spin chucks 921 at a plurality of locations along a circumferential direction of a peripheral portion of the substrate, a center nozzle 924 placed above a nearly central portion of the face of the substrate W held by the substrate stage 922, and an edge nozzle 926 placed above the peripheral portion of the substrate W. The center nozzle 924 and the edge nozzle 926 are directed downward. A back nozzle 928 is positioned below a nearly central portion of the backside of the substrate W, and directed upward. The edge nozzle 926 is adapted to be movable in a diametrical direction and a height direction of the substrate W.

The width of movement L of the edge nozzle 926 is set such that the edge nozzle 926 can be arbitrarily positioned in a direction toward the center from the outer peripheral end surface of the substrate, and a set value for L is inputted, according to the size, usage, or the like of the substrate W. Normally, an edge cut width C is set in the range of 2 mm to 5 mm. In the case where a rotational speed of the substrate is a certain value or higher at which the amount of liquid migration from the backside to the face is not problematic, the copper layer, and the like within the edge cut width C can be removed.

Next, the method of cleaning with this bevel etching and backside cleaning apparatus 22 will be described. First, the substrate W is horizontally rotated integrally with the substrate stage 922, with the substrate being held horizontally by the spin chucks 921 of the substrate stage 922. In this state, an acid solution is supplied from the center nozzle 924 to the central portion of the face of the substrate W. The acid solution may be a non-oxidizing acid, and hydrofluoric acid, hydrochloric acid, sulfuric acid, citric acid, oxalic acid, or the like is used. On the other hand, an oxidizing agent solution is supplied continuously or intermittently from the edge nozzle 926 to the peripheral portion of the substrate W. As the oxidizing agent solution, one of an aqueous solution of ozone, an aqueous solution of hydrogen peroxide, an aqueous solution of nitric acid, and an aqueous solution of sodium hypochlorite is used, or a combination of these is used.

In this manner, the copper layer, or the like formed on the upper surface and end surface in the region of the edge cut width C of the substrate W is rapidly oxidized with the oxidizing agent solution, and is simultaneously etched with the acid solution supplied from the center nozzle 924 and spread on the entire face of the substrate, whereby it is dissolved and removed. By mixing the acid solution and the oxidizing agent solution at the peripheral portion of the substrate, a steep etching profile can be obtained, in comparison with a mixture of them which is produced in advance being supplied. At this time, the copper etching rate is determined by their concentrations. If a natural oxide film of copper is formed in the circuit-formed portion on the face of the substrate, this natural oxide film is immediately removed by the acid solution spreading on the entire face of the substrate according to rotation of the substrate, and does not grow any more. After the supply of the acid solution from the center nozzle 924 is stopped, the supply of the oxidizing agent solution from the edge nozzle 926 is stopped. As a result, silicon exposed on the surface is oxidized, and deposition of copper can be suppressed.

On the other hand, an oxidizing agent solution and a silicon oxide film etching agent are supplied simultaneously or alternately from the back nozzle 928 to the central portion of the backside of the substrate. Therefore, copper or the like adhering in a metal form to the backside of the substrate W can be oxidized with the oxidizing agent solution, together with silicon of the substrate, and can be etched and removed with the silicon oxide film etching agent. This oxidizing agent solution is preferably the same as the oxidizing agent solution supplied to the face, because the types of chemicals are decreased in number. Hydrofluoric acid can be used as the silicon oxide film etching agent, and if hydrofluoric acid is used as the acid solution on the face of the substrate, the types of chemicals can be decreased in number. Thus, if the supply of the oxidizing agent is stopped first, a hydrophobic surface is obtained. If the etching agent solution is stopped first, a water-saturated surface (a hydrophilic surface) is obtained, and thus the backside surface can be adjusted to a condition that will satisfy the requirements of a subsequent process.

In this manner, the acid solution, i.e., etching solution is supplied to the substrate W to remove metal ions remaining on the surface of the substrate W. Then, pure water is supplied to replace the etching solution with pure water and remove the etching solution, and then the substrate is dried by spin-drying. In this way, removal of the copper layer in the edge cut width C at the peripheral portion on the face of the substrate, and removal of copper contaminants on the backside are performed simultaneously to thus allow this treatment to be completed, for example, within 80 seconds. The etching cut width of the edge can be set arbitrarily (from 2 to 5 mm), but the time required for etching does not depend on the cut width.

Figure 8:
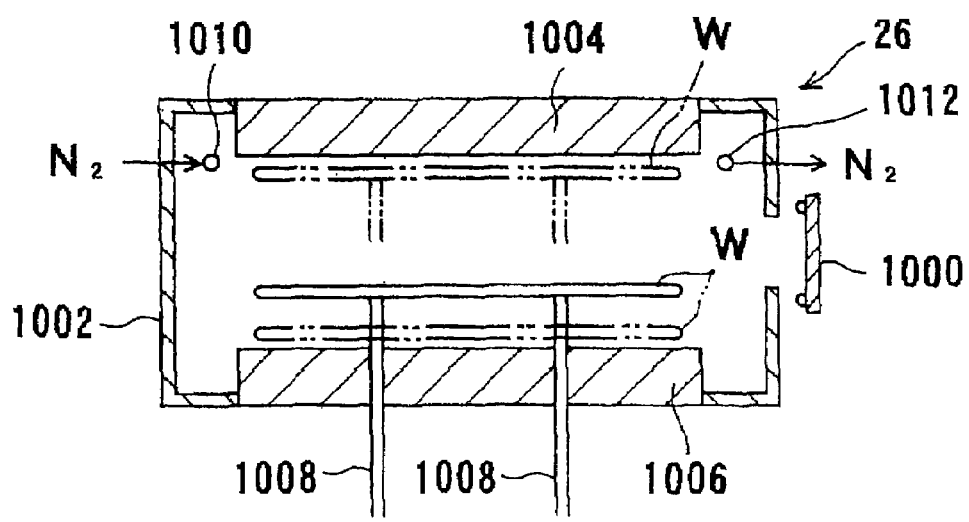
FIG. 8 is a plan cross-sectional view showing an example of a heating treatment apparatus shown in FIG. 2.
Figure 9:
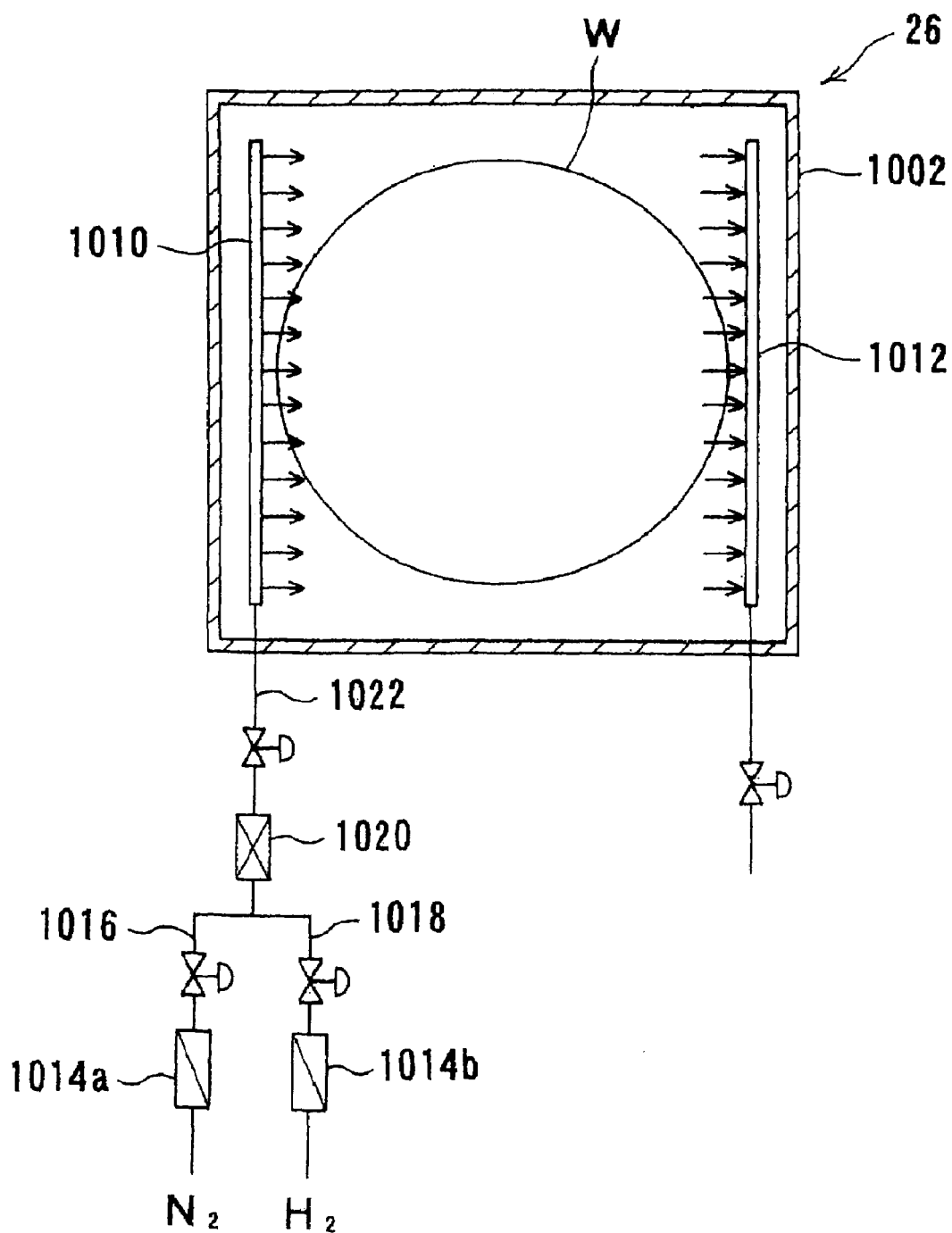
FIG. 9 is a plan cross-sectional view showing an example of the heating treatment apparatus shown in FIG. 2.

FIGS. 8 and 9 show a heat treatment (annealing) apparatus 26. The annealing apparatus 26 comprises a chamber 1002 having a gate 1000 for taking in and taking out the substrate W, a hot plate 1004 disposed at an upper position in the chamber 1002 for heating the substrate W to e.g. 400° C., and a cool plate 1006 disposed at a lower position in the chamber 1002 for cooling the substrate W by, for example, flowing cooling water inside the cool plate 1006. The annealing apparatus 26 also has a plurality of vertically movable elevating pins 1008 penetrating the cool plate 1006 and extending upward and downward therethrough for placing and holding the substrate W on them. The annealing apparatus further includes a gas introduction pipe 1010 for introducing an antioxidant gas between the substrate W and the hot plate 1004 during annealing, and a gas discharge pipe 1012 for discharging the gas which has been introduced from the gas introduction pipe 1010 and flowed between the substrate W and the hot plate 1004. The pipes 1010 and 1012 are disposed on the opposite sides of the hot plate 1004.

The gas introduction pipe 1010 is connected to a mixed gas introduction line 1022 which in turn is connected to a mixer 1020 where a $N_2$ gas introduced through a $N_2$ gas introduction line 1016 containing a filter 1014a, and a $H_2$ gas introduced through a $H_2$ gas introduction line 1018 containing a filter 1014b, are mixed to form a mixed gas which flows through the line 1022 into the gas introduction pipe 1010.

In operation, the substrate W, which has been carried in the chamber 1002 through the gate 1000, is held on the elevating pins 1008 and the elevating pins 1008 are raised up to a position at which the distance between the substrate W held on the lifting pins 1008 and the hot plate 1004 becomes about 0.1 to 1.0 mm, for example. In this state, the substrate W is then heated to e.g. 400° C. through the hot plate 1004 and, at the same time, the antioxidant gas is introduced from the gas introduction pipe 1010 and the gas is allowed to flow between the substrate W and the hot plate 1004 while the gas is discharged from the gas discharge pipe 1012, thereby annealing the substrate W while preventing its oxidation. The annealing treatment may be completed in about several tens of seconds to 60 seconds. The heating temperature of the substrate may be selected in the range of 100 to 600° C.

After the completion of the annealing, the elevating pins 1008 are lowered down to a position at which the distance between the substrate W held on the elevating pins 1008 and the cool plate 1006 becomes 0 to 0.5 mm, for example. In this state, by introducing cooling water into the cool plate 1006, the substrate W is cooled by the cool plate 1006 to a temperature of 100° C. or lower in about 10 to 60 seconds. The cooled substrate is transferred to the next step.

In this embodiment, a mixed gas of $N_2$ gas with several percentages of $H_2$ gas is used as the above antioxidant gas. However, $N_2$ gas may be used singly.

FIGS. 10 through 16 show a pretreatment apparatus 28 for performing a pretreatment of electroless plating of the substrate. The pretreatment apparatus 28 includes a fixed frame 52 that is mounted on the upper part of a frame 50, and a movable frame 54 that moves up and down relative to the fixed frame 52. A processing head 60, which includes a bottomed cylindrical housing portion 56, opening downwardly, and a substrate holder 58, is suspended from and supported by the movable frame 54. In particular, a head-rotating servomotor 62 is mounted to the movable frame 54, and the housing portion 56 of the processing head 60 is coupled to the lower end of the downward-extending output shaft (hollow shaft) 64 of the servomotor 62.

Figure 13:
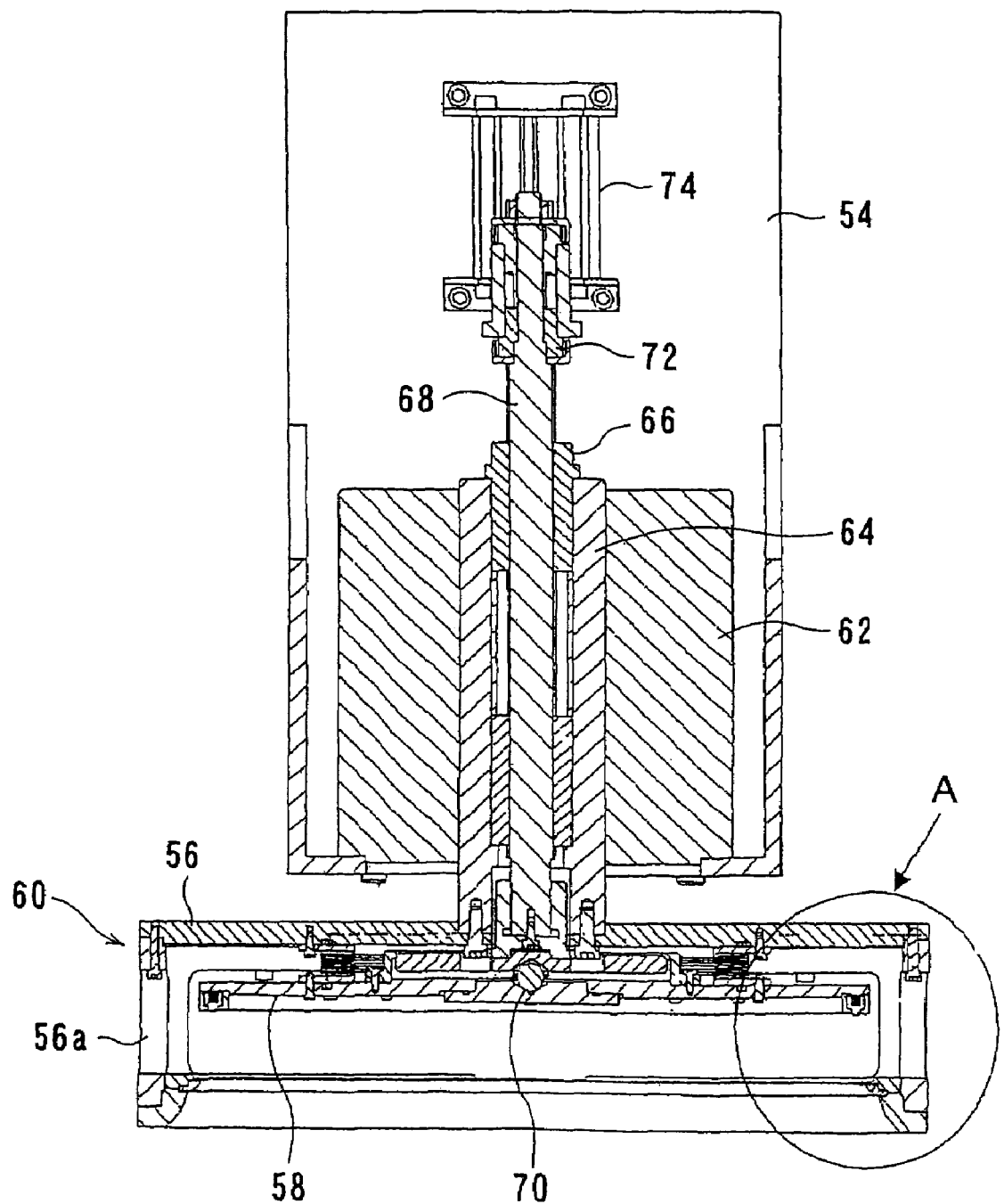
FIG. 13 is a cross-sectional view showing a processing head of the pretreatment apparatus shown in FIG. 2 at the time of substrate transfer.

As shown in FIG. 13, a vertical shaft 68, which rotates together with the output shaft 64 via a spline 66, is inserted in the output shaft 64, and the substrate holder 58 of the processing head 60 is coupled to the lower end of the vertical shaft 68 via a ball joint 70. The substrate holder 58 is positioned within the housing portion 56. The upper end of the vertical shaft 68 is coupled via a bearing 72 and a bracket to a fixed ring-elevating cylinder 74 secured to the movable frame 54. Thus, by the actuation of the cylinder 74, the vertical shaft 68 moves vertically independently of the output shaft 64.

Linear guides 76, which extend vertically and guide vertical movement of the movable frame 54, are mounted to the fixed frame 52, so that by the actuation of a head-elevating cylinder (not shown), the movable frame 54 moves vertically by the guide of the linear guides 76.

Figure 14:
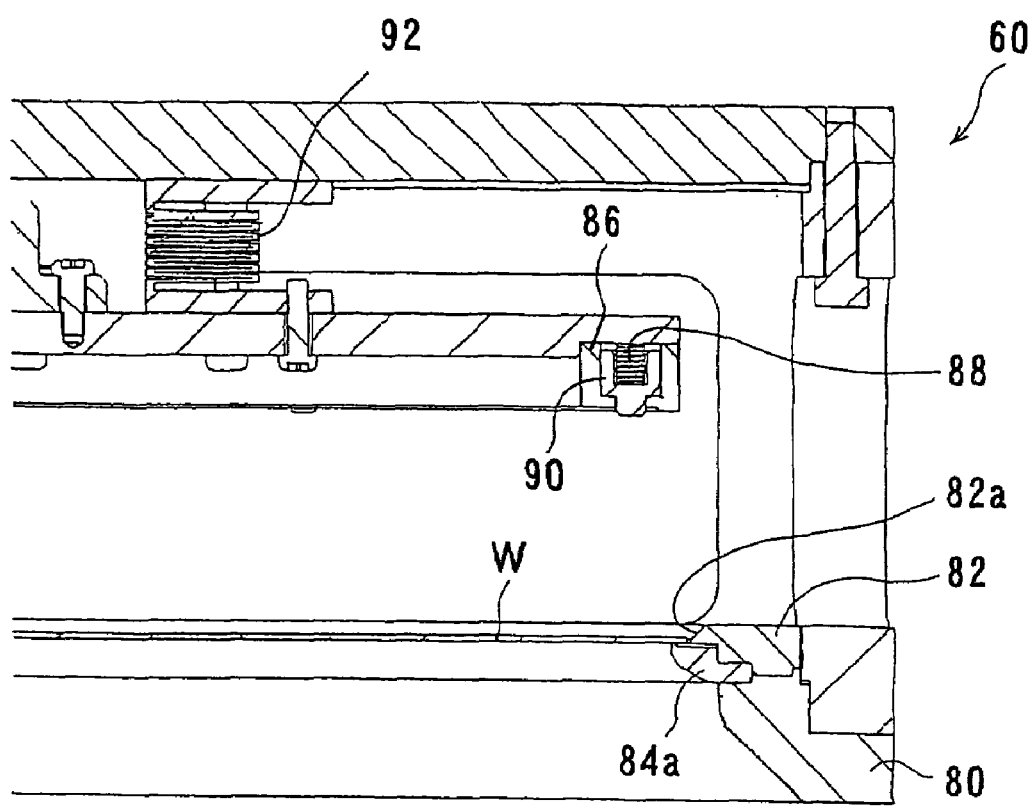
FIG. 14 is an enlarged view of A portion of FIG. 13 in the pretreatment apparatus shown in FIG. 2.
Figure 15:
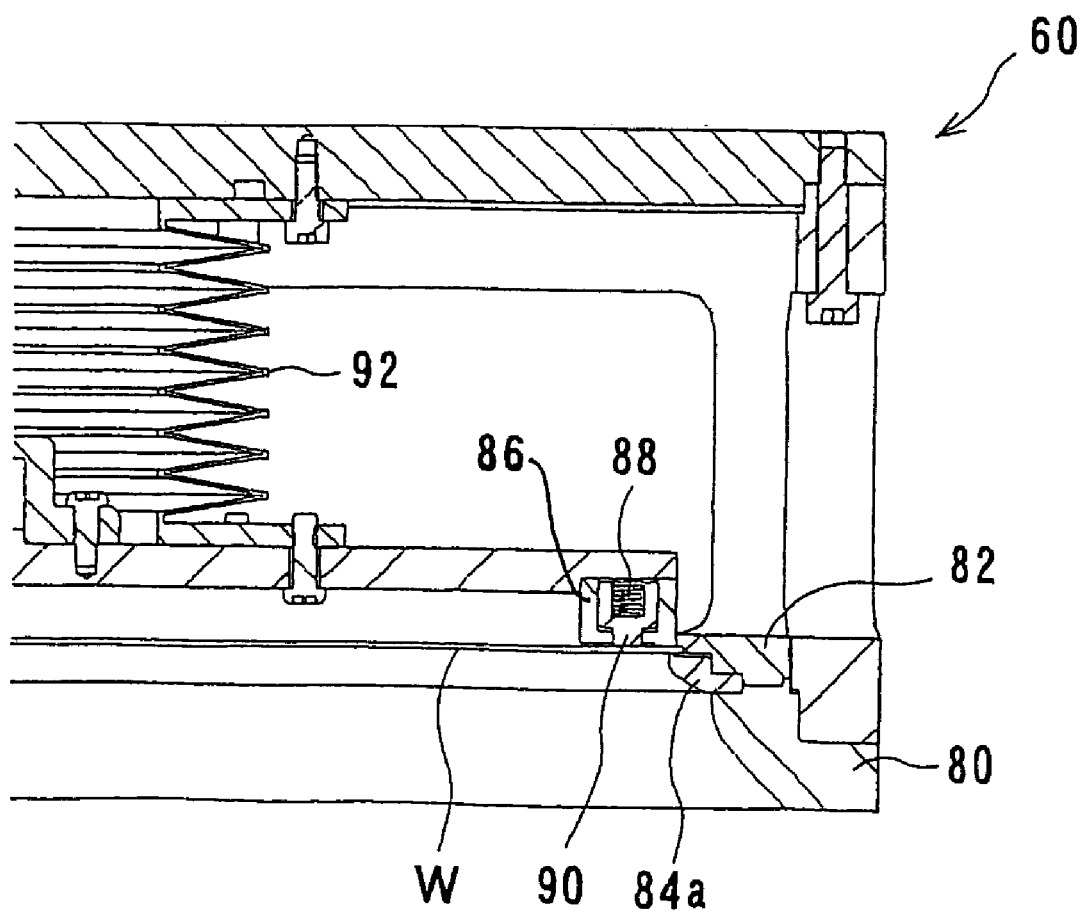
FIG. 15 is a view corresponding to FIG. 14 at the time of substrate fixing.

Substrate insertion windows 56a for inserting the substrate W into the housing portion 56 are formed in the circumferential wall of the housing portion 56 of the processing head 60. Further, as shown in FIGS. 14 and 150, a seal ring 84 is provided in the lower portion of the housing portion 56 of the processing head 60, an outer peripheral portion of the seal ring 84a being sandwiched between a main frame 80 made of e.g. PEEK and a guide frame 82 made of e.g. polyethylene. The seal ring 84a is provided to make contact with a peripheral portion of the lower surface of the substrate W to seal the peripheral portion.

On the other hand, a substrate fixing ring 86 is fixed to a peripheral portion of the lower surface of the substrate holder 58. Columnar pushers 90 each protrudes downwardly from the lower surface of the substrate fixing ring 86 by the elastic force of a spring 88 disposed within the substrate fixing ring 86 of the substrate holder 58. Further, a flexible cylindrical bellows-like plate 92 made of e.g. Teflon (registered trademark) is disposed between the upper surface of the substrate holder 58 and the upper wall of the housing portion 56 to hermetically seal therein.

When the substrate holder 58 is in a raised position, a substrate W is inserted from the substrate insertion window 56a into the housing portion 56. The substrate W is then guided by a tapered surface 82a provided in the inner circumferential surface of the guide frame 82, and positioned and placed at a predetermined position on the upper surface of the seal ring 84a. In this state, the substrate holder 58 is lowered so as to bring the pushers 90 of the substrate fixing ring 86 into contact with the upper surface of the substrate W. The substrate holder 58 is further lowered so as to press the substrate W downwardly by the elastic forces of the springs 88, thereby forcing the seal ring 84a to make pressure contact with a peripheral portion of the front surface (lower surface) of the substrate W to seal the peripheral portion while nipping the substrate W between the housing portion 56 and the substrate holder 58 to hold the substrate W.

When the head-rotating servomotor 62 is driven while the substrate W is thus held by the substrate holder 58, the output shaft 64 and the vertical shaft 68 inserted in the output shaft 64 rotate together via the spline 66, whereby the substrate holder 58 rotates together with the housing portion 56.

At a position below the processing head 60, there is provided an upward-open treatment tank 100 comprising an outer tank 100a and an inner tank 100b which have a slightly larger inner diameter than the outer diameter of the processing head 60. A pair of leg portions 104, which is mounted to a lid 102, is rotatably supported on the outer circumferential portion of the treatment tank 100. Further, a crank 106 is integrally coupled to each leg portion 106, and the free end of the crank 106 is rotatably coupled to the rod 110 of a lid-moving cylinder 108. Thus, by the actuation of the lid-moving cylinder 108, the lid 102 moves between a treatment position at which the lid 102 covers the top opening of the treatment tank 100 and a retreat position beside the treatment tank 100. In the surface (upper surface) of the lid 102, there is provided a nozzle plate 112 having a large number of jet nozzles 112a for jetting outwardly (upwardly), for example, electrolytic ionic water having reducing power.

Figure 16:
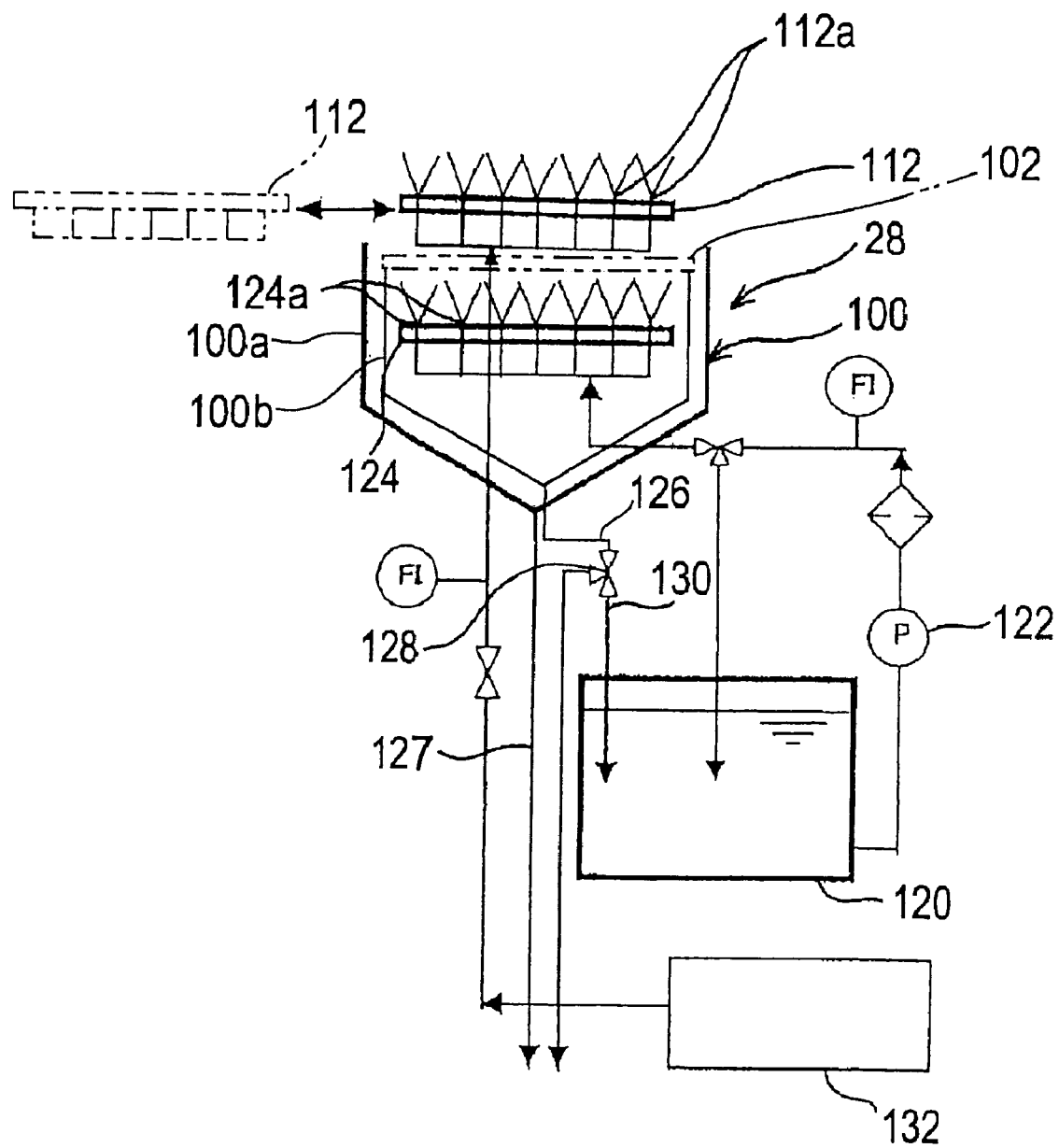
FIG. 16 is a systematic diagram of the pretreatment apparatus shown in FIG. 2.

Further, as shown in FIG. 16, a nozzle plate 124 having a plurality of jet nozzles 124a for jetting upwardly a chemical liquid supplied from a chemical liquid tank 120 by driving the chemical liquid pump 122 is provided in the inner tank 100b of the treatment tank 100 in such a manner that the jet nozzles 124a are equally distributed over the entire surface of the cross section of the inner tank 100b. A drainpipe 126 for draining a chemical liquid (waste liquid) to the outside is connected to the bottom of the inner tank 100b. A three-way valve 128 is provided in the drainpipe 127 connected to the bottom of the outer tank 100a.

By lowering the processing head 60 holding the substrate so as to cover or close the top opening of the inner tank 100b of the treatment tank 100 with the processing head 60 and then jetting a chemical liquid from the jet nozzles 124a of the nozzle plate 124 disposed in the inner tank 100b of the treatment tank 100 toward the substrate W, the chemical liquid can be jetted uniformly onto the entire lower surface (processed surface) of the substrate W and the chemical liquid can be discharged out from the discharge pipe 126 while preventing scattering of the chemical liquid to the outside. Further, by raising the processing head 60 and closing the top opening of the inner tank 100b of the treatment tank 100 with the lid 102, and then jetting a rinsing liquid from the jet nozzles 112a of the nozzle plate 112 disposed on the upper surface of the lid 102 toward the substrate W held in the processing head 60, the rinsing treatment (cleaning treatment) is carried out to remove the chemical liquid from the surface of the substrate. Because the rinsing liquid passes through the clearance between the outer tank 100a and the inner tank 100b and is discharged through the drainpipe 127, the rinsing liquid is prevented from flowing into the inner tank 100b and from being mixed with the chemical liquid.

Figure 10:
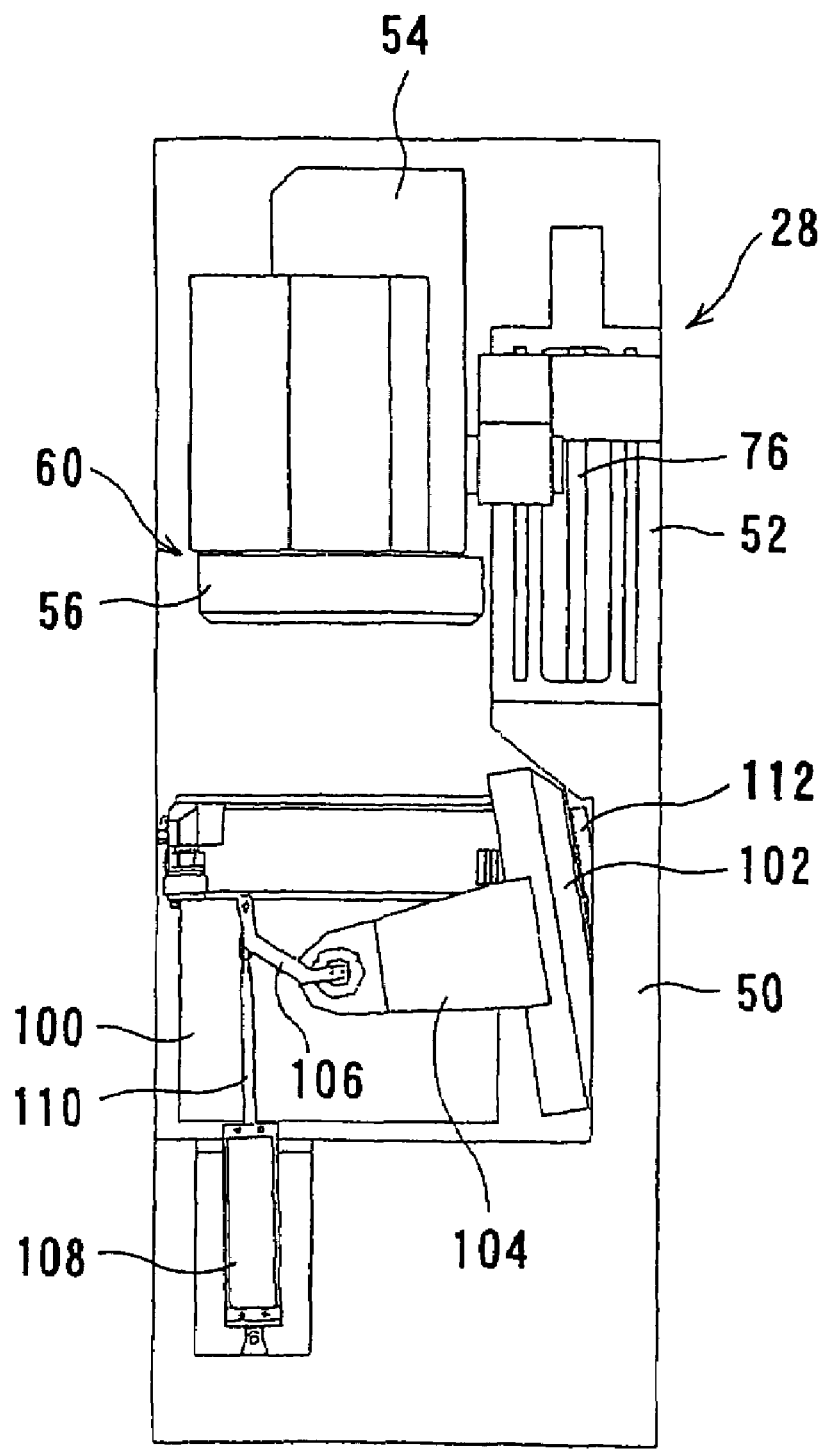
FIG. 10 is a front view of a pretreatment apparatus shown in FIG. 2 at the time of substrate transfer.
Figure 11:
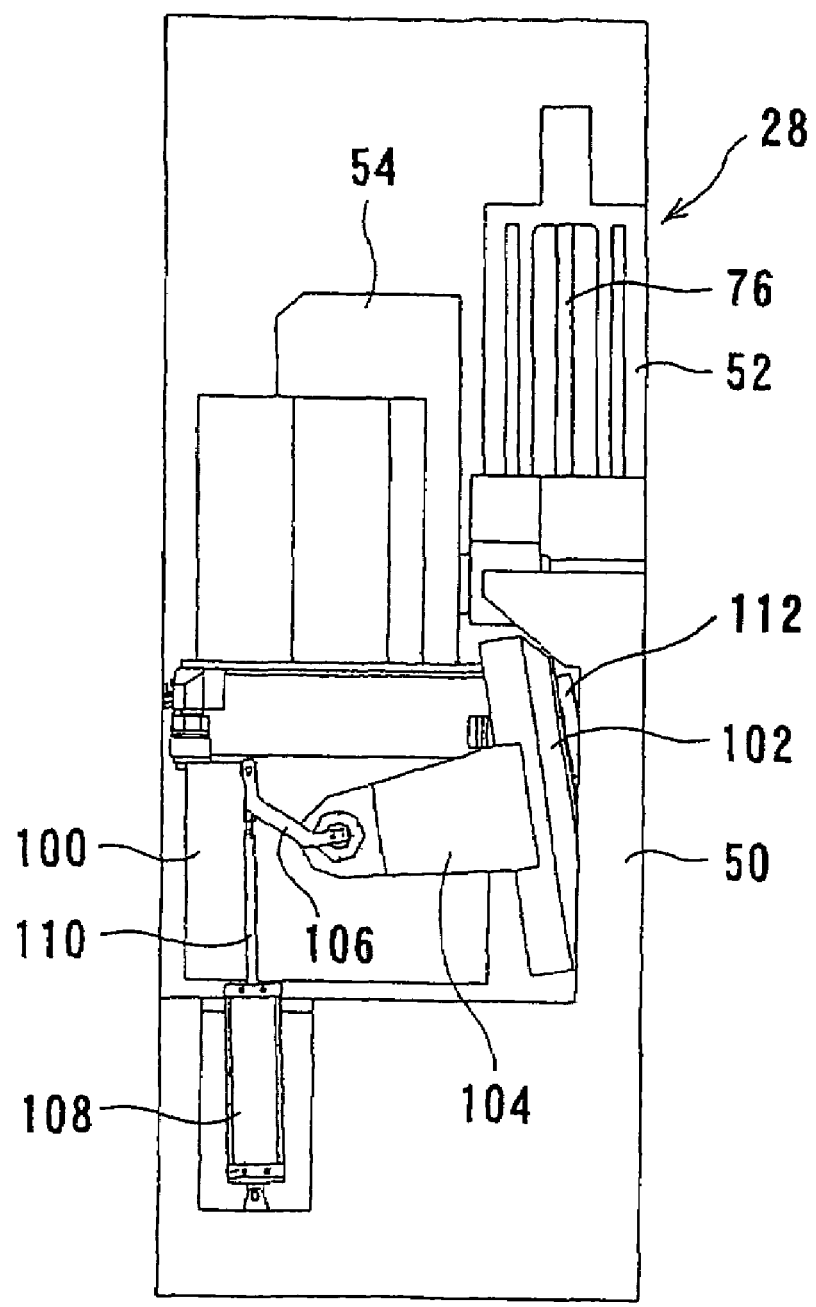
FIG. 11 is a front view of the pretreatment apparatus shown in FIG. 2 at the time of chemical treatment.
Figure 12:
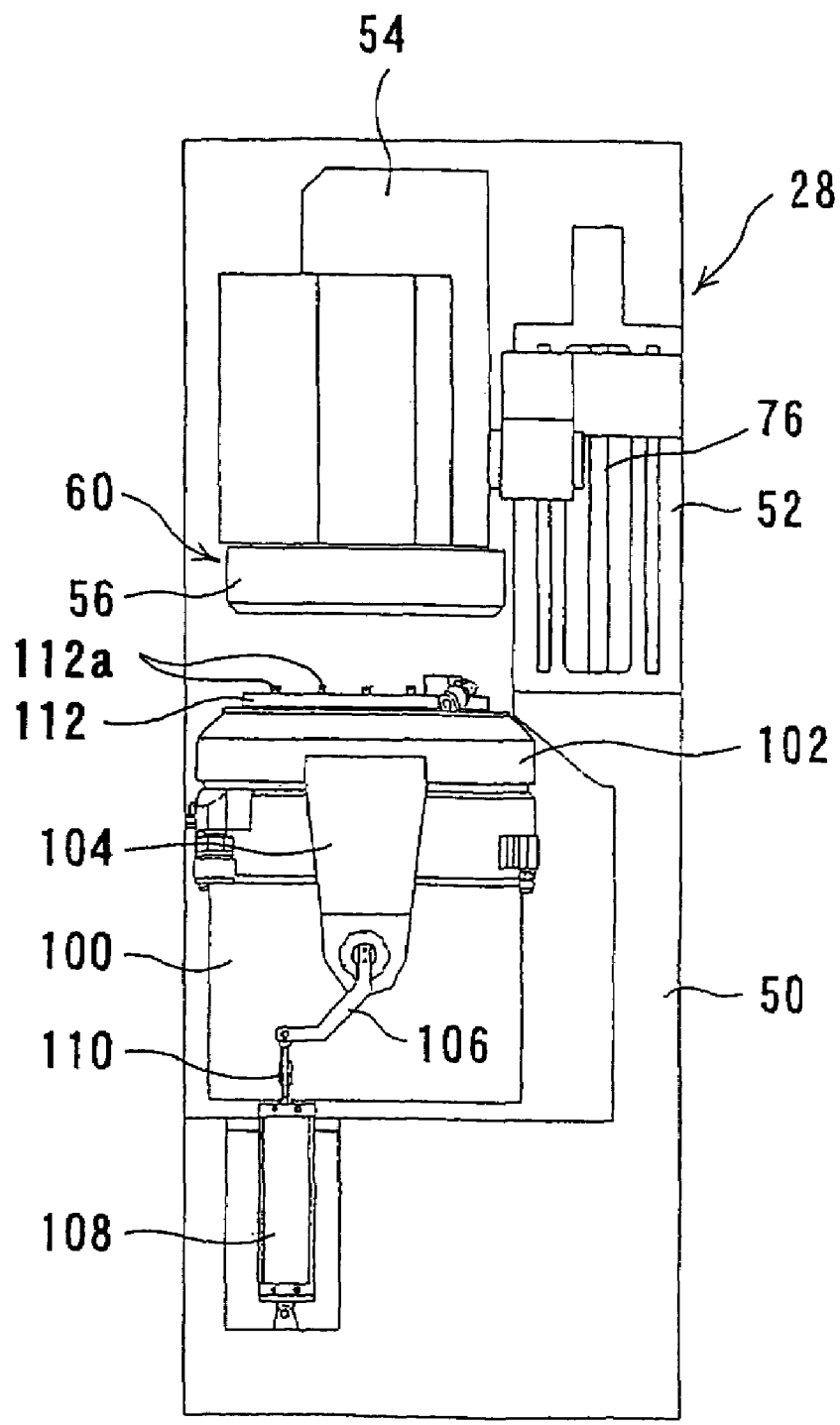
FIG. 12 is a front view of the pretreatment apparatus shown in FIG. 2 at the time of rinsing.

According to the pretreatment apparatus 28, the substrate W is inserted into the processing head 60 and held therein when the processing head 60 is in the raised position, as shown in FIG. 10. Thereafter, as shown in FIG. 11, the processing head 60 is lowered to the position at which it covers the top opening of the inner tank 100b of the treatment tank 100. While rotating the processing head 60 and thereby rotating the substrate W held in the processing head 60, a chemical liquid is jetted from the jet nozzles 124a of the nozzle plate 124 disposed in the inner tank 100b of the treatment tank 100 toward the substrate W, thereby jetting the chemical liquid uniformly onto the entire surface of the substrate W. The processing head 60 is raised and stopped at a predetermined position and, as shown in FIG. 12, the lid 102 in the retreat position is moved to the position at which it covers the top opening of the inner tank 100b of the treatment tank 100. A rinsing liquid is then jetted from the jet nozzles 112a of the nozzle plate 112 disposed on the upper surface of the lid 102 toward the rotating substrate W held in the processing head 60. The chemical treatment by the chemical liquid and the rinsing treatment by the rinsing liquid of the substrate W can thus be carried out successively while avoiding mixing of the two liquids.

The lowermost position of the processing head 60 may be adjusted to adjust the distance between the substrate W held in the processing head 60 and the nozzle plate 124, whereby the region of the substrate W onto which the chemical liquid is jetted from the jet nozzles 124a of the nozzle plate 124 and the jetting pressure can be adjusted as desired. Here, when the pretreatment liquid such as a chemical liquid is circulated and reused, active components are reduced by progress of the treatment, and the pretreatment liquid (chemical liquid) is taken out due to attachment of the treatment liquid to the substrate. Therefore, it is desirable to provide a pretreatment liquid management unit (not shown) for analyzing composition of the pretreatment liquid and adding insufficient components. Specifically, a chemical liquid used for cleaning is mainly composed of acid or alkali. Therefore, for example, a pH of the chemical liquid is measured, a decreased content is replenished from the difference between a preset value and the measured pH, and a decreased amount is replenished using a liquid level meter provided in the chemical storage tank. Further, with respect to a catalytic liquid, for example, in the case of acid palladium solution, the amount of acid is measured by its pH, and the amount of palladium is measured by a titration method or nephelometry, and a decreased amount can be replenished in the same manner as the above.

FIGS. 17 through 23 show an electroless plating apparatus 30. This electroless plating apparatus 30, which is provided to form the protective film 9 shown in FIG. 1D, includes a plating tank 200 (see FIGS. 21 and 23) and a substrate head 204, disposed above the plating tank 200, for detachably holding a substrate W.

Figure 17:
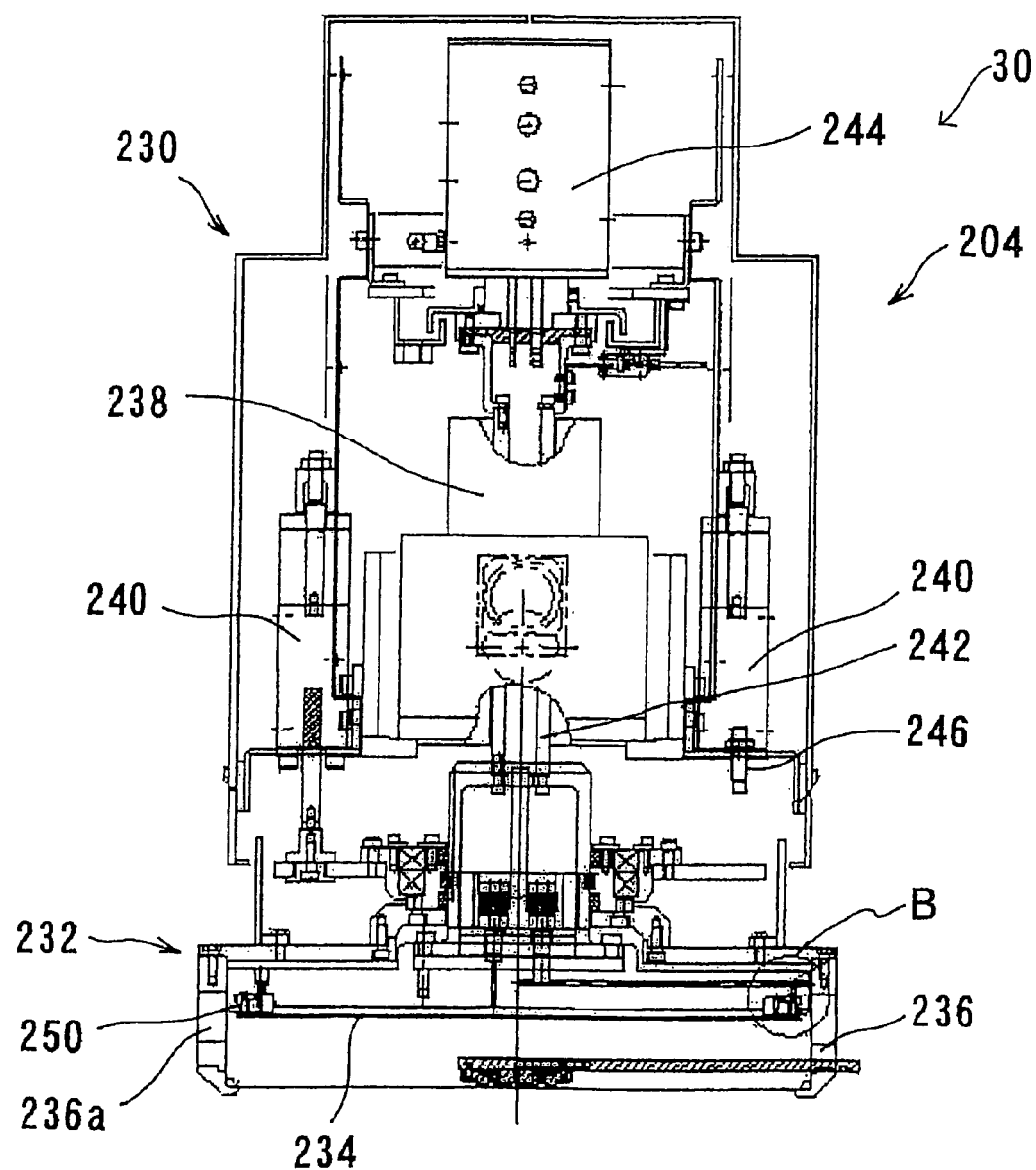
FIG. 17 is a cross-sectional view showing a substrate head in an electroless plating apparatus shown in FIG. 2 at the time of substrate transfer.

As shown in detail in FIG. 17, the processing head 204 has a housing 230 and a head portion 232. The head portion 232 mainly comprises a suction head 234 and a substrate receiver 236 for surrounding the suction head 234. The housing 230 accommodates therein a substrate rotating motor 238 and substrate receiver drive cylinders 240. The substrate rotating motor 238 has an output shaft (hollow shaft) 242 having an upper end coupled to a rotary joint 244 and a lower end coupled to the suction head 234 of the head portion 232. The substrate receiver drive cylinders 240 have respective rods coupled to the substrate receiver 236 of the head portion 232. Stoppers 246 are provided in the housing 230 for mechanically limiting upward movement of the substrate receiver 236.

The suction head 234 and the substrate receiver 236 are operatively connected to each other by a splined structure such that when the substrate receiver drive cylinders 240 are actuated, the substrate receiver 236 vertically moves relative to the suction head 234, and when the substrate rotating motor 238 is driven, the output shaft 242 thereof is rotated to rotate the suction head 234 with the substrate receiver 236.

Figure 18:
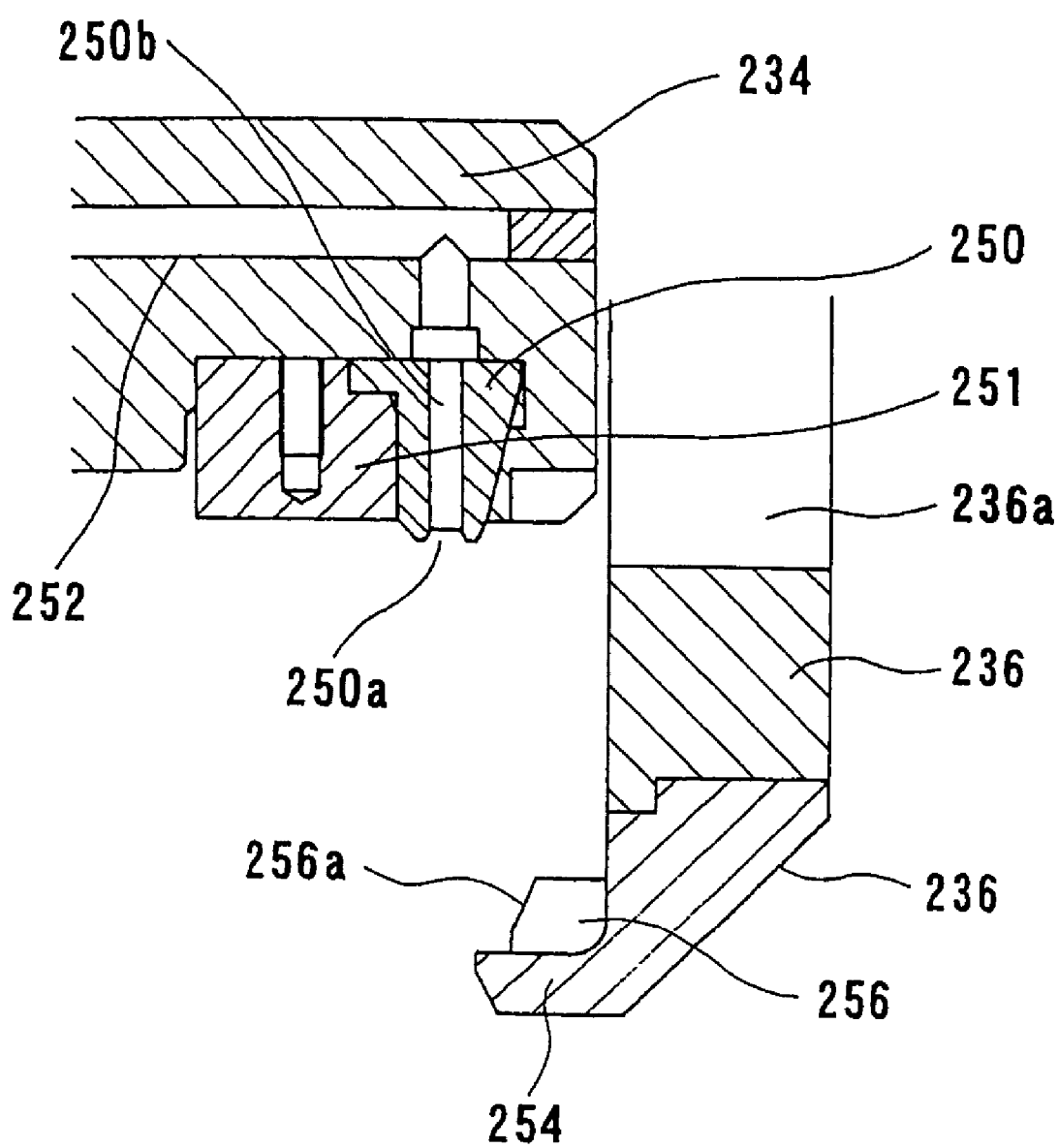
FIG. 18 is an enlarged view of B portion of FIG. 17.
Figure 19:
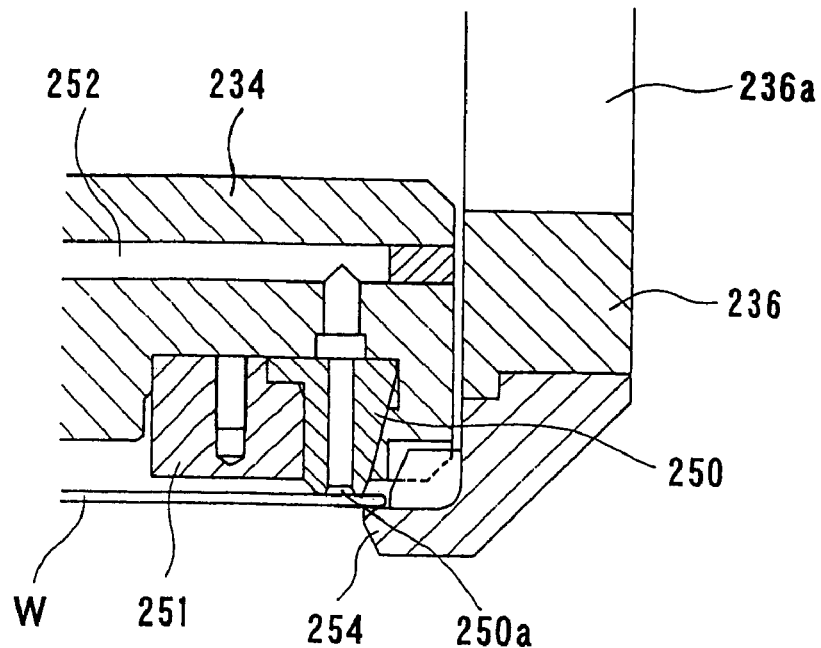
FIG. 19 is a view corresponding to FIG. 18 showing the substrate head at the time of substrate fixing.
Figure 20:
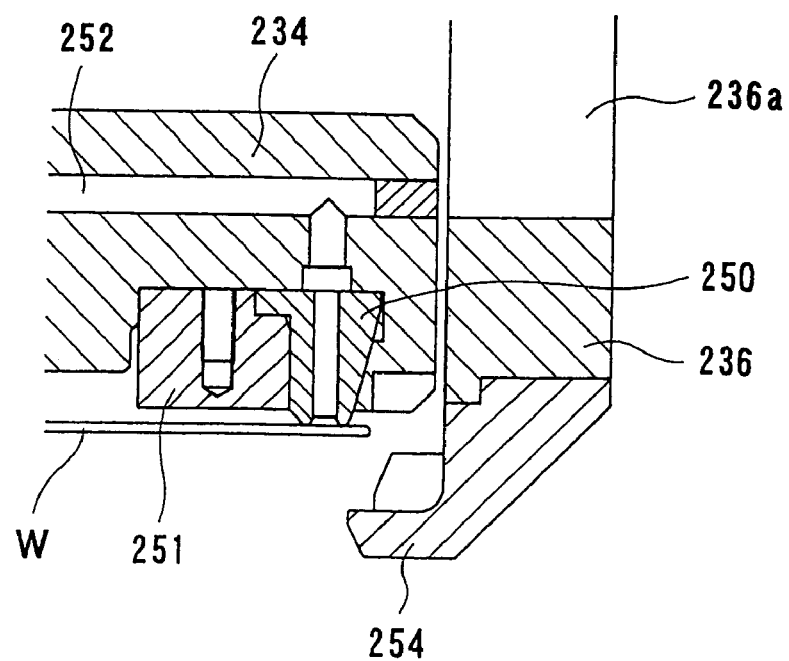
FIG. 20 is a view corresponding to FIG. 18 showing the substrate head at the time of plating process.

As shown in detail in FIGS. 18 through 20, a suction ring 250 for attracting and holding a substrate W against its lower surface to be sealed is mounted on a lower circumferential edge of the suction head 234 by a presser ring 251. The suction ring 250 has a recess 250a continuously defined in a lower surface thereof in a circumferential direction and in communication with a vacuum line 252 extending through the suction head 234 by a communication hole 250b that is defined in the suction ring 250. When the recess 250a is evacuated, the substrate W is attracted to and held by the suction ring 250. Because the substrate W is attracted under vacuum to the suction ring 250 along a radially narrow circumferential area provided by the recess 250a, any adverse effects such as flexing caused by the vacuum on the substrate W are minimized. When the suction ring 250 is dipped in the plating solution (treatment liquid), not only the surface (lower surface) of the substrate W, but also its circumferential edge, can be dipped in the plating solution. The substrate W is released from the suction ring 250 by introducing $N_2$ into the vacuum line 252.

The substrate receiver 236 is in the form of a downwardly open, hollow bottomed cylinder having substrate insertion windows 236a defined in a circumferential wall thereof for inserting therethrough the substrate W into the substrate receiver 236. The substrate receiver 236 also has an annular ledge 254 projecting inwardly from its lower end, and annular protrusions 256 disposed on an upper surface of the annular ledge 254 and each having a tapered inner circumferential surface 256a for guiding the substrate W.

As shown in FIG. 18, when the substrate receiver 236 is lowered, the substrate W is inserted through the substrate insertion window 236a into the substrate receiver 236. The substrate W thus inserted is guided by the tapered surfaces 256a of the protrusions 256 and positioned thereby onto the upper surface of the ledge 254 in a predetermined position thereon. The substrate receiver 236 is then elevated until it brings the upper surface of the substrate W placed on the ledge 254 into abutment against the suction ring 250 of the suction head 234, as shown in FIG. 19. Then, the recess 250a in the vacuum ring 250 is evacuated through the vacuum line 252 to attract the substrate W while sealing the upper peripheral edge surface of the substrate W against the lower surface of the suction ring 250. In order to plate the substrate W, as shown in FIG. 20, the substrate receiver 236 is lowered several mm to space the substrate W from the ledge 254, keeping the substrate W attracted only by the suction ring 250. The substrate W now has its lower peripheral edge surface prevented from not being plated because it is held out of contact with the ledge 254.

Figure 21:
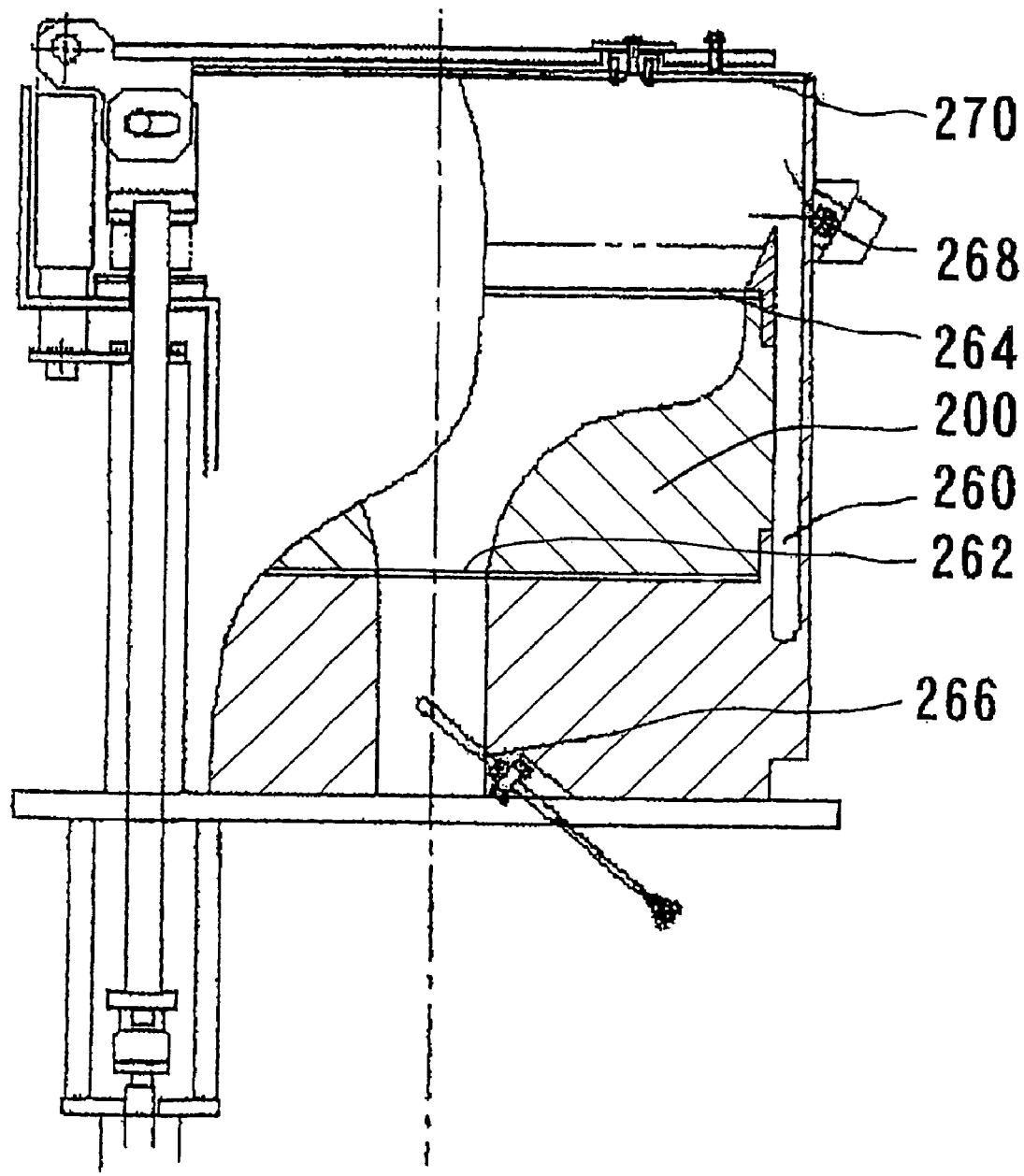
FIG. 21 is a front view with partially cross-section showing a plating tank of the electroless plating apparatus shown in FIG. 2 when a plating tank cover is closed.

FIG. 21 shows the details of the plating tank 200. The plating tank 200 is connected at the bottom to a plating solution supply pipe 308 (see FIG. 23), and is provided in the peripheral wall with a plating solution recovery groove 260. In the plating tank 200, there are disposed two current plates 262, 264 for stabilizing the flow of a plating solution flowing upward. A thermometer 266 for measuring the temperature of the plating solution introduced into the plating tank 200 is disposed at the bottom of the plating tank 200. Further, on the outer surface of the peripheral wall of the plating tank 200 and at a position slightly higher than the liquid level of the plating solution held in the plating tank 200, there is provided a jet nozzle 268 for jetting a stop liquid which is a neutral liquid having a pH of 6 to 7.5, for example, pure water, inwardly and slightly upwardly in the normal direction. After plating, the substrate W held in the head portion 232 is raised and stopped at a position slightly above the surface of the plating solution. In this state, pure water (stop liquid) is immediately jetted from the jet nozzle 268 toward the substrate W to cool the substrate W, thereby preventing progress of plating by the plating solution remaining on the substrate W.

Further, at the top opening of the plating tank 200, there is provided a plating tank cover 270 which closes the top opening of the plating tank 200 in a non-plating time, such as idling time, so as to prevent unnecessary evaporation of the plating solution from the plating tank 200.

Figure 23:
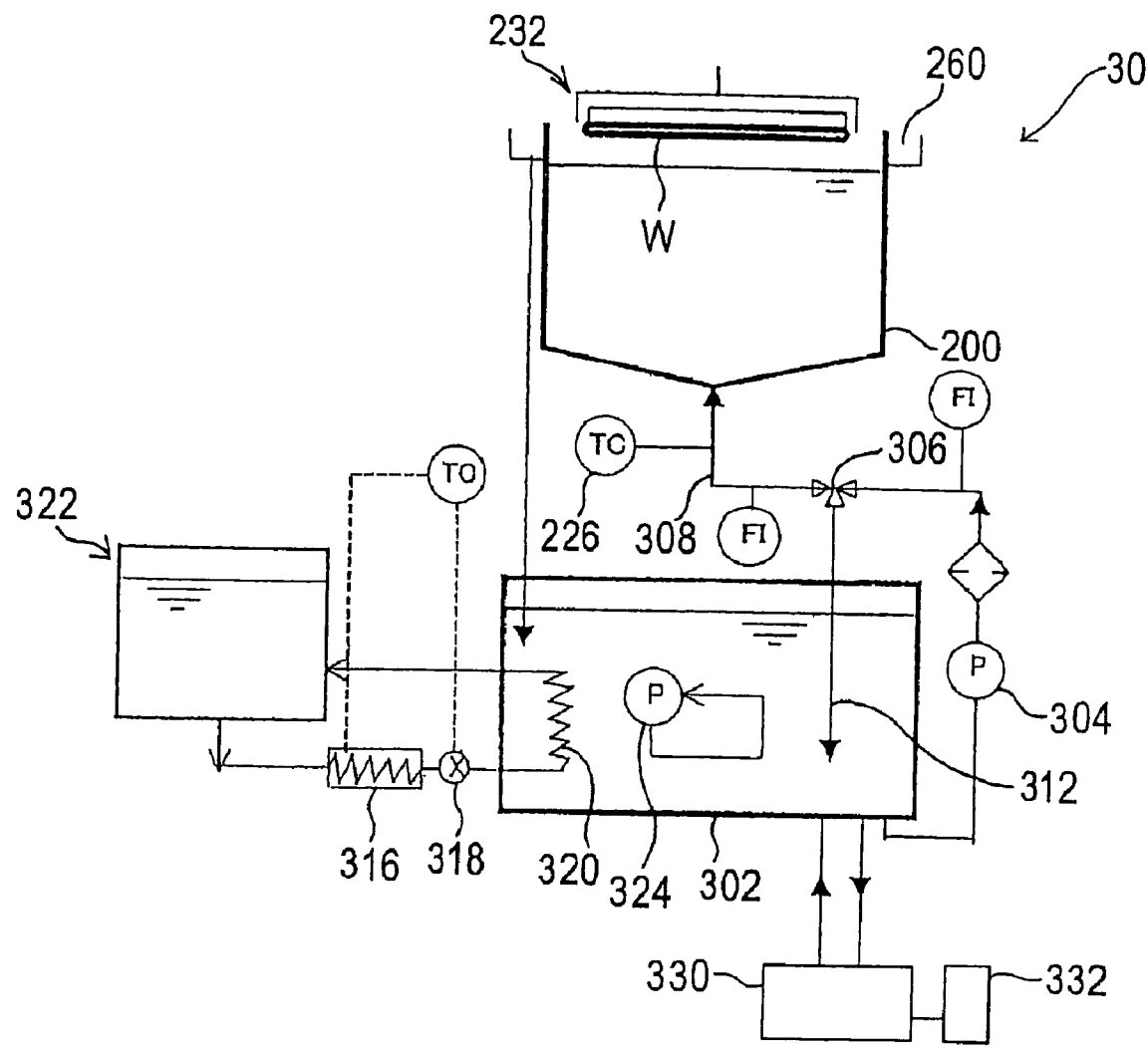
FIG. 23 is a systematic diagram of the electroless plating apparatus shown in FIG. 2.

As shown in FIG. 23, a plating solution supply pipe 308 extending from a plating solution storage tank 302 and having a plating solution supply pump 304 and a three-way valve 306 is connected to the plating tank 200 at the bottom of the plating tank 200. With this arrangement, during a plating process, a plating solution is supplied into the plating tank 200 from the bottom of the plating tank 200, and the overflowing plating solution is recovered by the plating solution storage tank 302 through the plating solution recovery groove 260. Thus, the plating solution can be circulated. A plating solution return pipe 312 for returning the plating solution to the plating solution storage tank 302 is connected to one of the ports of the three-way valve 306. Thus, the plating solution can be circulated even in a standby condition of plating, and a plating solution circulating system is constructed. As described above, the plating solution in the plating solution storage tank 302 is always circulated through the plating solution circulating system, and hence a lowering rate of the concentration of the plating solution can be reduced and the number of the substrates W which can be processed can be increased, compared with the case in which the plating solution is simply stored.

Particularly, in this embodiment, by controlling the plating solution supply pump 304, the flow rate of the plating solution which is circulated at a standby of plating or at a plating process can be set individually. Specifically, an amount of circulating plating solution at the standby of plating is in the range of 2 to 20 litter/minute, for example, and an amount of circulating plating solution at the plating process is in the range of 0 to 10 litter/minute, for example. With this arrangement, a large amount of circulating plating solution at the standby of plating can be ensured to keep a temperature of the plating bath in the cell constant, and the flow rate of the circulating plating solution is made smaller at the plating process to form a protective film (plated film) having a more uniform thickness.

The thermometer 266 provided in the vicinity of the bottom of the plating tank 200 measures a temperature of the plating solution introduced into the plating tank 200, and controls a heater 316 and a flow meter 318 described below.

Specifically, in this embodiment, there are provided a heating device 322 for heating the plating solution indirectly by a heat exchanger 320 which is provided in the plating solution in the plating solution storage tank 302 and uses water as a heating medium which has been heated by a separate heater 316 and has passed through the flow meter 318, and a stirring pump 324 for mixing the plating solution by circulating the plating solution in the plating solution storage tank 302. This is because in the plating, in some cases, the plating solution is used at a high temperature (about 80° C.), and the structure should cope with such cases. This method can prevent very delicate plating solution from being mixed with foreign matter or the like unlike an in-line heating method.

Figure 22:
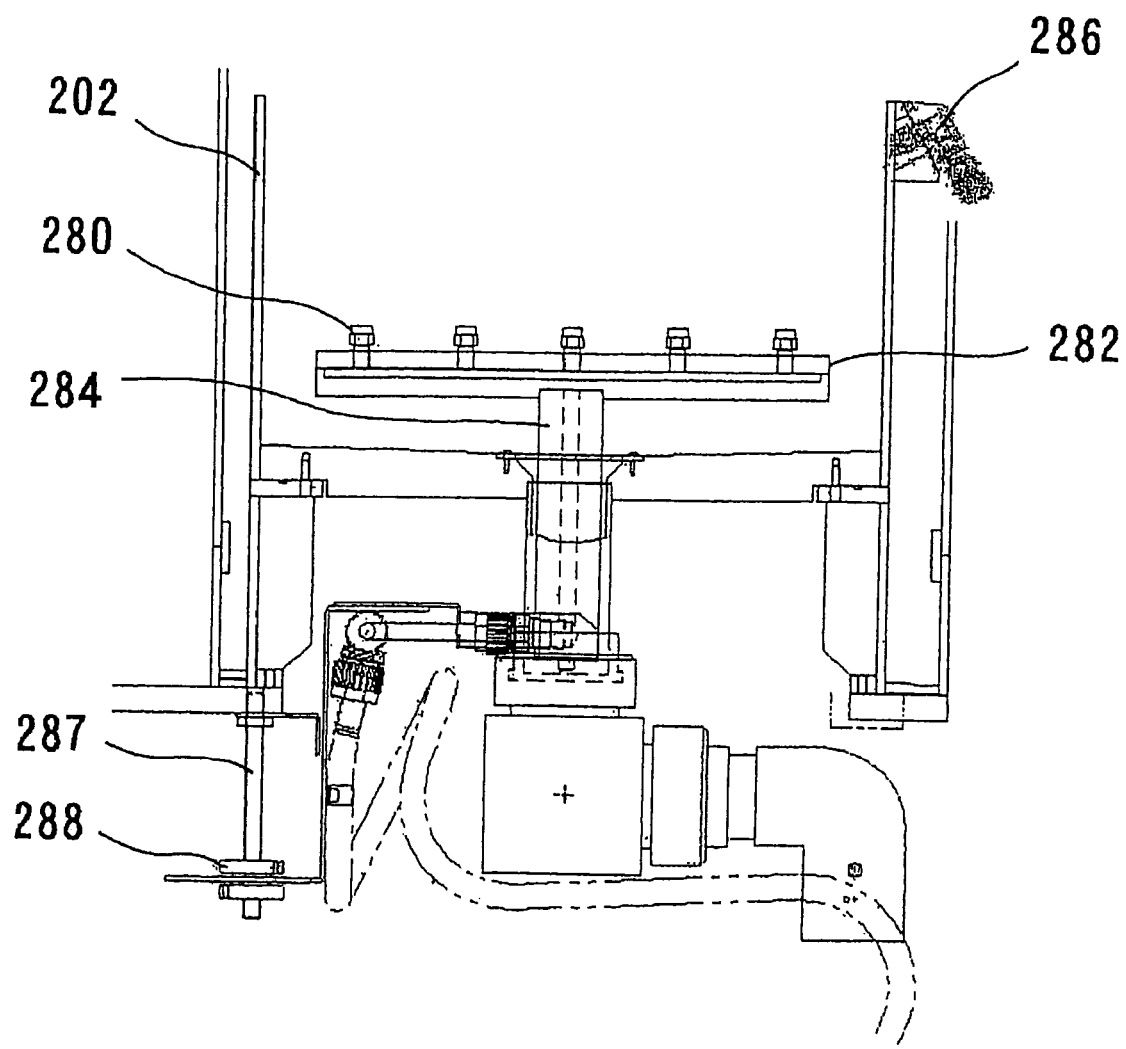
FIG. 22 is a cross-sectional view of a cleaning tank in the electroless plating apparatus shown in FIG. 2.

FIG. 22 shows the details of a cleaning tank 202 provided beside the plating tank 200. At the bottom of the cleaning tank 202, there is provided a nozzle plate 282 having a plurality of jet nozzles 280, attached thereto, for upwardly jetting a rinsing liquid such as pure water. The nozzle plate 282 is coupled to an upper end of a nozzle lifting shaft 284. The nozzle lifting shaft 284 can be moved vertically by changing the position of engagement between a nozzle position adjustment screw 287 and a nut 288 engaging the screw 287 so as to optimize the distance between the jet nozzles 280 and a substrate W located above the jet nozzles 280.

Further, on the outer surface of the peripheral wall of the cleaning tank 202 and at a position above the jet nozzles 280, there is provided a head cleaning nozzle 286 for jetting a cleaning liquid, such as pure water, inwardly and slightly downwardly onto at least a portion, which was in contact with the plating solution, of the head portion 232 of the substrate head 204.

In operating the cleaning tank 202, the substrate W held in the head portion 232 of the substrate head 204 is located at a predetermined position in the cleaning tank 202. A cleaning liquid (rinsing liquid), such as pure water, is jetted from the jet nozzles 280 to clean (rinse) the substrate W, and at the same time, a cleaning liquid such as pure water is jetted from the head cleaning nozzle 286 to clean at least a portion, which was in contact with the plating solution, of the head portion 232 of the substrate head 204, thereby preventing a deposit from accumulating on that portion which was immersed in the plating solution.

According to this electroless plating apparatus 30, when the substrate head 204 is in a raised position, the substrate W is held by vacuum attraction in the head portion 232 of the substrate head 204 as described above, while the plating solution in the plating tank 200 is allowed to circulate.

When plating is performed, the plating tank cover 270 is opened, and the substrate head 204 is lowered, while the substrate head 204 is rotating, so that the substrate W held in the head portion 232 is immersed in the plating solution in the plating tank 200.

After immersing the substrate W in the plating solution for a predetermined time, the substrate head 204 is raised to lift the substrate W from the plating solution in the plating tank 200 and, as needed, pure water (stop liquid) is immediately jetted from the jet nozzle 268 toward the substrate W to cool the substrate W, as described above. The substrate head 204 is further raised to lift the substrate W to a position above the plating tank 200, and the rotation of the substrate head 204 is stopped.

Next, while the substrate W is held by vacuum attraction in the head portion 232 of the substrate head 204, the substrate head 204 is moved to a position right above the cleaning tank 202. While rotating the substrate head 204, the substrate head 204 is lowered to a predetermined position in the cleaning tank 202. A cleaning liquid (rinsing liquid), such as pure water, is jetted from the jet nozzles 280 to clean (rinse) the substrate W, and at the same time, a cleaning liquid such as pure water is jetted from the head cleaning nozzle 286 to clean at least a portion, which was in contact with the plating solution, of the head portion 232 of the substrate head 204.

After completion of cleaning of the substrate W, the rotation of the substrate head 204 is stopped, and the substrate head 204 is raised to lift the substrate W to a position above the cleaning tank 202. Further, the substrate head 204 is moved to the transfer position between the transfer robot 16 and the substrate head 204, and the substrate W is transferred to the transfer robot 16, and is transported to a next process by the transfer robot 16.

As shown in FIG. 23, the electroless plating apparatus 30 is provided with a plating solution management unit 330 for measuring an amount of the plating solution held by the electroless plating apparatus 30 and for analyzing composition of the plating solution by an absorptiometric method, a titration method, an electrochemical measurement, or the like, and replenishing components which are insufficient in the plating solution. In the plating solution management unit 330, signals indicative of the analysis results are processed to replenish insufficient components from a replenishment tank (not shown) to the plating solution storage tank 302 using a metering pump, thereby controlling the amount of the plating solution and composition of the plating solution. Thus, thin film plating can be realized in a good reproducibility.

The plating solution management unit 330 has a dissolved oxygen densitometer 332 for measuring dissolved oxygen in the plating solution held by the electroless plating apparatus 30 by an electrochemical method, for example. According to the plating solution management unit 330, dissolved oxygen concentration in the plating solution can be controlled at a constant value on the basis of indication of the dissolved oxygen densitometer 332 by deaeration, nitrogen blowing, or other methods. In this manner, the dissolved oxygen concentration in the plating solution can be controlled at a constant value, and the plating reaction can be achieved in a good reproducibility.

When the plating solution is used repeatedly, certain components are accumulated by being carried in from the outside or decomposition of the plating solution, resulting in lowering of reproducibility of plating and deteriorating of film quality. By adding a mechanism for removing such specific components selectively, the life of the plating solution can be prolonged and the reproducibility can be improved.

Figure 24:
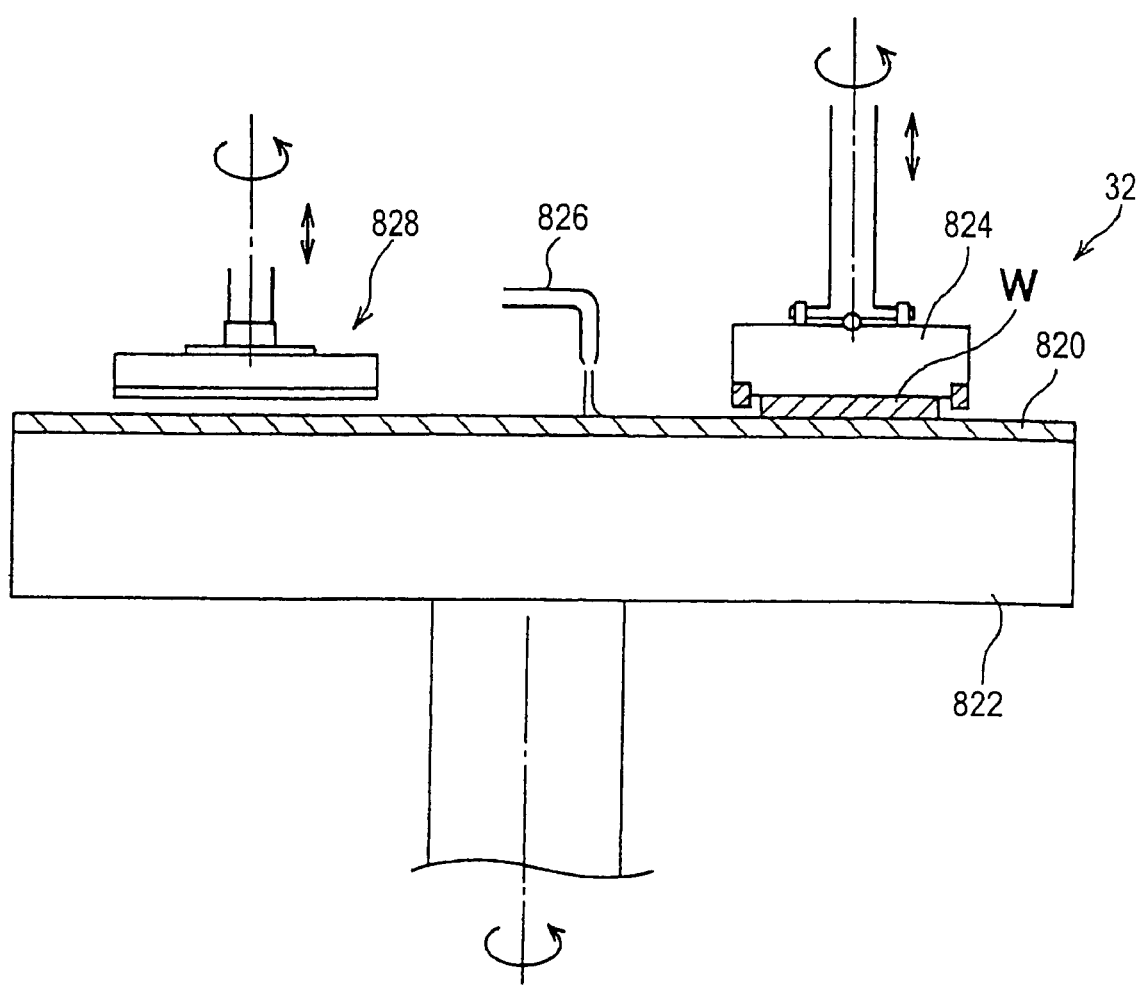
FIG. 24 is a schematic view showing an example of a polishing apparatus shown in FIG. 2.

FIG. 24 shows an example of a polishing apparatus (CMP apparatus) 32. The polishing apparatus 32 comprises a polishing table 822 having a polishing surface composed of a polishing cloth (polishing pad) 820 which is attached to the upper surface of the polishing table 822, and a top ring 824 for holding a substrate W with its to-be-polished surface facing the polishing table 822. In the polishing apparatus 32, the surface of the substrate W is polished by rotating the polishing table 822 and the top ring 824 about their own axes, respectively, and supplying a polishing liquid from a polishing liquid nozzle 826 provided above the polishing table 822 while pressing the substrate W against the polishing cloth 820 of the polishing table 822 at a given pressure by the top ring 824. It is possible to use a fixed abrasive type of pad containing fixed abrasive particles as the polishing pad.

The polishing power of the polishing surface of the polishing cloth 820 decreases with a continuation of a polishing operation of the CMP apparatus 32. In order to restore the polishing power of the polishing surface of the polishing cloth 820, a dresser 828 is provided to conduct dressing of the polishing cloth 820, for example, at the time of replacing the substrate W. In the dressing, while rotating the dresser 828 and the polishing table 822 respectively, the dressing surface (dressing member) of the dresser 828 is pressed against the polishing cloth 820 of the polishing table 822, thereby removing the polishing liquid and chips adhering to the polishing surface and, at the same time, flattening and dressing the polishing surface, whereby the polishing surface is regenerated. The polishing table 822 may be provided with a monitor for monitoring the surface state of the substrate to detect in situ the end point of polishing, or with a monitor for inspecting in situ the finish state of the substrate.

Figure 25:
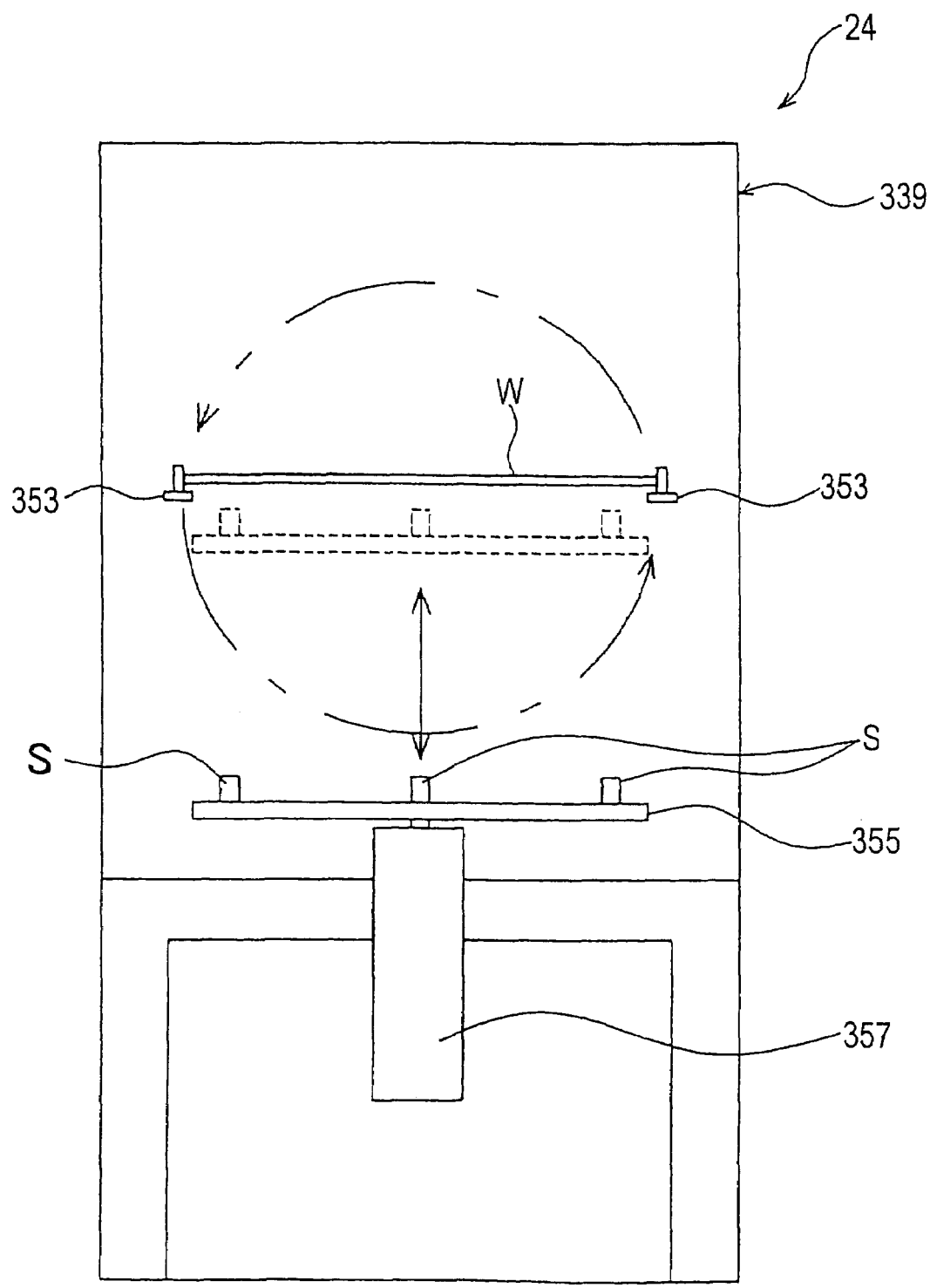
FIG. 25 is a schematic front view of neighborhood of a reversing machine in a film thickness measuring instrument shown in FIG. 2.
Figure 26:
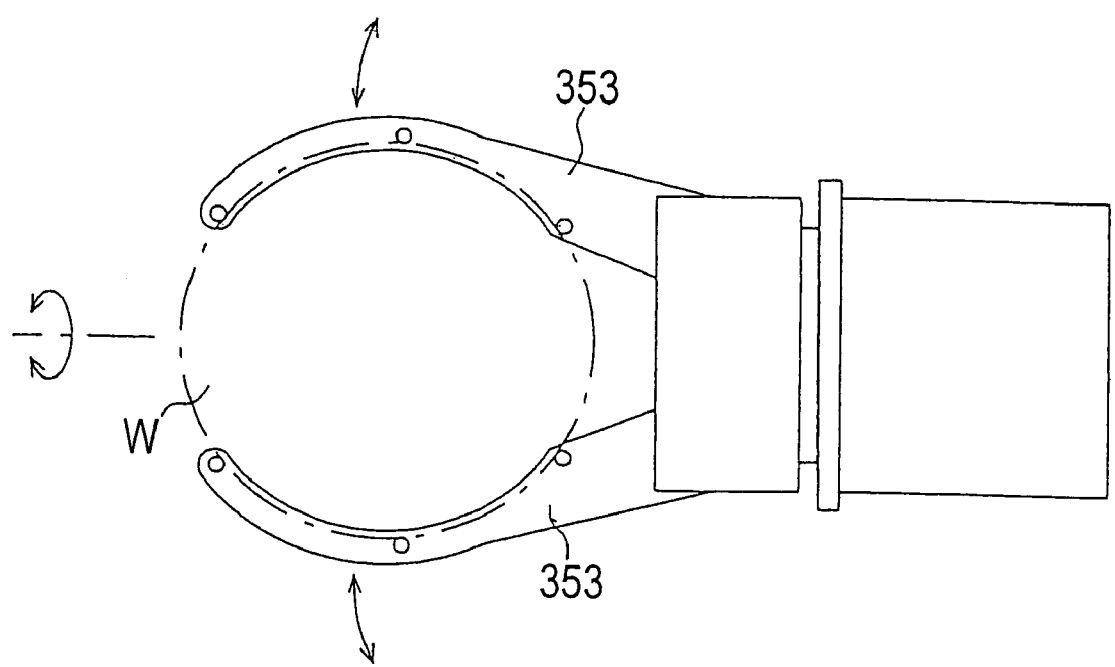
FIG. 26 is a plan view of a reversing arm section.

FIGS. 25 and 26 show the film thickness measuring instrument 24 provided with a reversing machine. As shown in the FIGS. 25 and 26, the film thickness measuring instrument 24 is provided with a reversing machine 339. The reversing machine 339 includes reversing arms 353, 353. The reversing arms 353, 353 put a substrate W therebetween and hold its outer periphery from right and left sides, and rotate the substrate W through 1800, thereby turning the substrate over. A circular mounting base 355 is disposed immediately below the reversing arms 353, 353 (reversing stage), and a plurality of film thickness sensors S are provided on the mounting base 355. The mounting base 355 is adapted to be movable vertically by a drive mechanism 357.

During reversing of the substrate W, the mounting base 355 waits at a position, indicated by solid lines, below the substrate W. Before or after reversing, the mounting base 355 is raised to a position indicated by dotted lines to bring the film thickness sensors S close to the substrate W gripped by the reversing arms 353, 353, thereby measuring the film thickness.

According to this embodiment, since there is no restriction such as the arms of the transfer robot, the film thickness sensors S can be installed at arbitrary positions on the mounting base 355. Further, the mounting base 355 is adapted to be movable upward and downward, so that the distance between the substrate W and the sensors S can be adjusted at the time of measurement. It is also possible to mount plural types of sensors suitable for the purpose of detection, and change the distance between the substrate W and the sensors each time measurements are made by the respective sensors. However, the mounting base 355 moves upward and downward, thus requiring certain measuring time.

An eddy current sensor, for example, may be used as the film thickness sensor S. The eddy current sensor measures a film thickness by generating an eddy current and detecting the frequency or loss of the current that has returned through the substrate W, and is used in a non-contact manner. An optical sensor may also be suitable for the film thickness sensor S. The optical sensor irradiates a light onto a sample, and measures a film thickness directly based on information of the reflected light. The optical sensor can measure a film thickness not only for a metal film but also for an insulating film such as an oxide film. Places for setting the film thickness sensor S are not limited to those shown in the drawings, but the sensor may be set at any desired places for measurement in any desired numbers.

Figure 27:
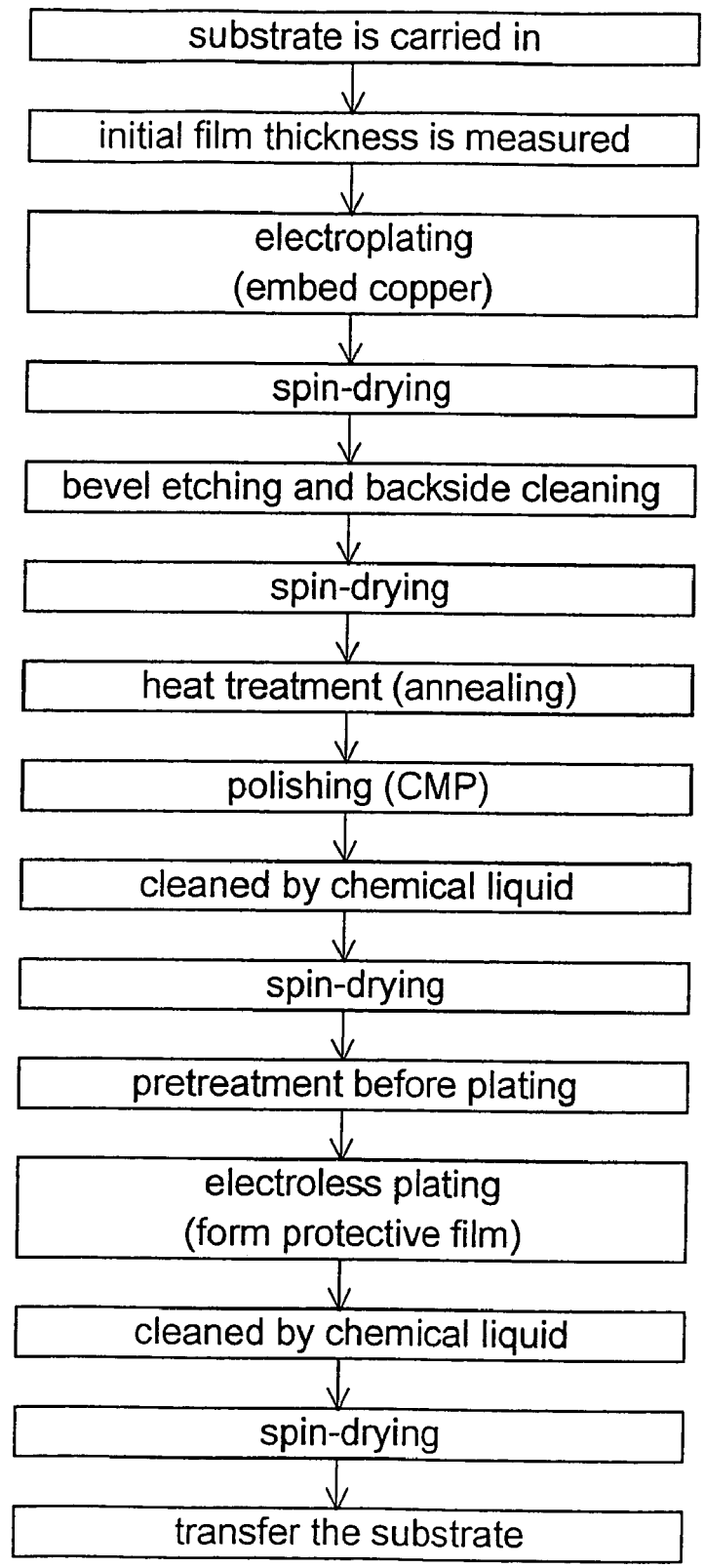
FIG. 27 is a flow chart in a substrate processing apparatus shown in FIG. 2.

Next, a sequence of processing for forming copper interconnects on the substrate having the seed layer 6 formed thereon, as shown in FIG. 1A, which is carried out by the substrate processing apparatus having the above structure will be described with reference to FIG. 27.

First, the substrate W having the seed layer 6 formed in its surface, as shown in FIG. 1A, is taken out one by one from a transfer box 10, and is carried in the loading/unloading station 14. The substrate W, which has carried in the loading/unloading station 14, is transferred to the thickness measuring instrument 24 by the transfer robot 16, and an initial film thickness (film thickness of the seed layer 6) is measured by the thickness measuring instrument 24. Thereafter, if necessary, the substrate is inverted and transferred to the plating apparatus 18. In the plating apparatus 18, as shown in FIG. 1B, the copper layer 7 is deposited on the surface of the substrate W to embed copper.

Then, the substrate W having the copper layer 7 formed thereon is transferred to the cleaning and drying apparatus 20 by the transfer robot 16, and the substrate W is cleaned by pure water and spin-dried. Alternatively, in a case where a spin-drying function is provided in the plating apparatus 18, the substrate W is spin-dried (removal of liquid) in the plating apparatus 18, and then the dried substrate is transferred to the bevel etching and backside cleaning apparatus 22.

In the bevel etching and backside cleaning apparatus 22, unnecessary copper attached to the bevel (edge) of the substrate W is removed by etching, and at the same time, the backside surface of the substrate is cleaned by pure water or the like. Thereafter, as described above, the substrate W is transferred to the cleaning and drying apparatus 20 by the transfer robot 16, and the substrate W is cleaned by pure water and spin-dried. Alternatively, in a case where a spin-drying function is provided in the bevel etching and backside cleaning apparatus 22, the substrate W is spin-dried in the bevel etching and backside cleaning apparatus 22, and then the dried substrate is transferred to the heat treatment apparatus 26 by the transfer robot 16.

In the heat treatment apparatus 26, heat treatment (annealing) of the substrate W is carried out. Then, the substrate W after the heat treatment is transferred to the film thickness measuring instrument 24 by the transfer robot 16, and the film thickness of copper is measured by the film thickness measuring instrument 24. The film thickness of the copper layer 7 (see FIG. 1B) is obtained from the difference between this measured result and the measured result of the above initial film thickness. Then, for example, plating time of a subsequent substrate is adjusted according to the measured film thickness. If the film thickness of the copper layer 7 is insufficient, then additional formation of copper layer is performed by plating again. Then, the substrate W after the film thickness measurement is transferred to the polishing apparatus 32 by the transfer robot 16.

As shown in FIG. 1C, unnecessary copper layer 7 and the seed layer 6 deposited on the surface of the substrate W are polished and removed by the polishing apparatus 32 to flatten the surface of the substrate W. At this time, for example, the film thickness and the finishing state of the substrate are inspected by a monitor, and when an end point is detected by the monitor, polishing is finished. Then, the substrate W which has been polished is transferred to the cleaning and drying apparatus 20 by the transfer robot 16, and the surface of the substrate is cleaned by a chemical liquid and then cleaned (rinsed) with pure water, and then spin-dried by rotating the substrate at a high-speed in the cleaning and drying apparatus 20. After this spin-drying, the substrate W is transferred to the pretreatment apparatus 28 by the transfer robot 16.

In the pretreatment apparatus 28, a pretreatment before plating comprising at least one of attachment of Pd catalyst to the surface of the substrate and removal of oxide film attached to the exposed surface of the substrate, for example, is carried out. Then, the substrate after this pretreatment, as described above, is transferred to the cleaning and drying apparatus 20 by the transfer robot 16, and the substrate W is cleaned by pure water and spin-dried. Alternatively, in a case where a spin-drying function is provided in the pretreatment apparatus 28, the substrate W is spin-dried (removal of liquid) in the pretreatment apparatus 28, and then the dried substrate is transferred to the electroless plating apparatus 30 by the transfer robot 16.

In the electroless plating apparatus 30, as shown in FIG. 1D, for example, electroless CoWP plating is applied to the surfaces of the exposed interconnects 8 to form a protective film (plated film) 9 composed of CoWP alloy selectively on the exposed surfaces of the interconnects 8, thereby protecting the interconnects 8. The thickness of the protective film 9 is in the range of 0.1 to 500 nm, preferably in the range of 1 to 200 nm, more preferably in the range of 10 to 100 nm. At this time, for example, the thickness of the protective film 9 is monitored, and when the film thickness reaches a predetermined value, i.e., an end point is detected, the electroless plating is finished.

After the electroless plating, the substrate W is transferred to the cleaning and drying apparatus 20 by the transfer robot 16, and the surface of the substrate is cleaned by a chemical liquid, and cleaned (rinsed) with pure water, and then spin-dried by rotating the substrate at a high speed in the cleaning and drying apparatus 20. After the spin-drying, the substrate W is returned into the transfer box 10 via the loading/unloading station 14 by the transfer robot 16.

In this embodiment, copper is used as an interconnect material. However, besides copper, a copper alloy, silver, a silver alloy, and the like may be used.

EXAMPLE 1

Figure 28:
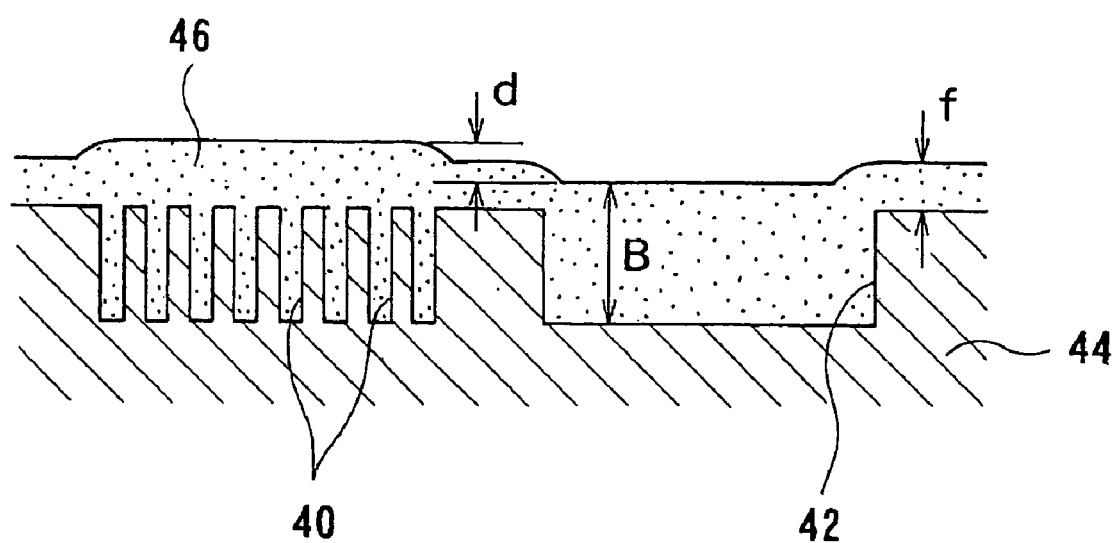
FIG. 28 is a diagram illustrating a flatness index and a surface step for evaluating a plated copper film in each Examples 1 through 4 and Comparative Example.

As shown in FIG. 28, a number of fine interconnect trenches 40 each having a width of 0.18 μm and a depth of 1.0 μm at close intervals of 0.18 μm, and a single wider interconnect trench 42 having a width of 20 μm and a depth of 1.0 μm are formed in a silicon wafer 44 having a diameter of 200 mm. After a barrier layer is deposited on the surface of the silicon wafer 44 by PVD, a copper seed layer as a conductive layer is deposited to a thickness of 80 nm on the barrier layer by PVD to prepare a sample.

Using a copper sulfate plating solution having the composition described below, the surface of the sample was subjected to electroplating by a plating apparatus which is essentially the same structure as the plating apparatus shown in FIG. 3 to deposit a copper plated film 46 having a thickness of about 500 nm on the surface of the copper seed layer.

Copper sulfate 5-hydrate: 200 g/L
Sulfuric acid: 50 g/L
Chloride: 60 mg/L
Sulfur compound (N,N-dimethyldithiomylpropyl sulfonic acid): 5 mg/L
High polymer compound (polypropylene glycol (molecular weight=700)): 100 mg/L
Nitrogen compound (safranine compound, Janus green B) 2 mg/L The plating conditions were as follows: The sample was held by the substrate holding portion 504. While the copper seed layer on the sample and the lower pad (porous member) 534a were held in contact with each other, the sample is rotated for 2 seconds. Then, the rotation of the sample was stopped, and an electric current at a current density of 10 mA/cm² was passed between the copper seed layer on the sample and the anode 526 for 10 seconds. After the supply of the electric current between the copper seed layer on the sample and the anode 526 was stopped, the lower pad 534a was released from the copper seed layer on the sample, and the electrode head 502 was left to stand for 2 to 3 seconds. The above process beginning with bringing the copper seed layer and the lower pad 534a into contact with each other was performed as one cycle, and repeated 15 times.

The trenches in the sample in which the film was deposited were cracked, and the cracked surface was observed by an SEM. The ratio of the film thickness "B" of a plated copper film 46 deposited in the wider interconnect trench 42 to the film thickness "f" of a plated copper film 46 deposited on an interconnect-free surface of the substrate was used as a flatness index (=B/f), and the distance (step) between the surface of the plated copper film 46 deposited in the wider interconnect trench 42 and the surface of a plated copper film 46 deposited in the region where the fine interconnect trenches 40 are closely formed is used as a surface step "d". The plated copper film 46 was evaluated in terms of the flatness index and the surface step thus defined. The process of evaluating the plated copper film with the flatness index and the surface step was applied to other Examples and Comparative Example to be described below.

EXAMPLE 2

Using the same sample as with Example 1 and under the same plating conditions as with Example 1, the surface of the sample was subjected to electroplating to deposit a plated copper film 46 (see FIG. 28) having a thickness of about 500 nm on the surface of the copper seed layer. However, the plating solution used contained 150 mg/L of polyoxypropylenetriol (molecular weight=300), rather than polypropylene glycol used in Example 1, as the high polymer compound. The deposited plated copper film 46 was evaluated in terms of the flatness index and the surface step as with Example 1.

EXAMPLE 3

Using the same sample as with Example 1 and the plating solution having the same composition as with Example 1, the surface of the sample was subjected to electroplating to deposit a plated copper film 46 (see FIG. 28) having a thickness of about 500 nm on the surface of the copper seed layer. The plating conditions were as follows: The copper seed layer on the sample and the lower pad (porous member) 534a were brought into contact with each other, and the lower pad 534a was vibrated for 3 seconds. After the vibration of the lower pad 534a was stopped, an electric current at a current density of 10 mA/cm² was passed between the copper seed layer on the sample and the anode 526 for 10 seconds. After the supply of the electric current between the copper seed layer on the sample and the anode 526 was stopped, the lower pad 534a was released from the copper seed layer on the sample, and the electrode head 502 was left to stand for 2 to 3 seconds. The above process beginning with bringing the copper seed layer and the lower pad 534a into contact with each other was performed as one cycle, and repeated 15 times. The grown plated copper film 46 was evaluated in terms of the flatness index and the surface step as with Example 1.

EXAMPLE 4

Using the same sample as with Example 1 and the plating solution having the same composition as with Example 1, the surface of the sample was subjected to electroplating to deposit a plated copper film 46 (see FIG. 28) having a thickness of about 500 nm on the surface of the copper seed layer.

The plating conditions were as follows: The copper seed layer on the sample and the lower pad (porous member) 534a were brought into contact with each other, and the sample held by the substrate holding portion 504 was rotated for 2 seconds. The rotation of the sample was stopped, and an electric current at a current density of 5 mA/cm² was passed between the copper seed layer on the sample and the anode 526 for 10 seconds. After the supply of the electric current between the copper seed layer on the sample and the anode 526 was stopped, the lower pad 534a was released from the copper seed layer on the sample, and the electrode head 502 was left to stand for 2 to 3 seconds. The above process beginning with bringing the copper seed layer and the lower pad 534a into contact with each other was performed as one cycle, and repeated 6 times. Then, the current density of the electric current to be passed between the copper seed layer on the sample and the anode 526 was changed from 5 mA/cm² to 20 mA/cm², and the same cycle as the cycle described above was repeated 6 times. The deposited plated copper film 46 was evaluated in terms of the flatness index and the surface step as with Example 1.

COMPARATIVE EXAMPLE

Using the same sample as with Example 1 and the plating solution having the same composition as with Example 1, the surface of the sample was subjected to electroplating to deposit a plated copper film 46 (see FIG. 28) having a thickness of about 500 nm on the surface of the copper seed layer. The plating conditions for the electrolytic plating were different from those of Examples as follows: No porous member was used, and an electric current at a current density of 10 mA/cm² was passed between the copper seed layer on the sample and the anode 526 for 150 seconds. The deposited plated copper film 46 was evaluated in terms of the flatness index and the surface step as with Example 1.

The results of the evaluation of the plated copper films in Examples 1 through 4 and Comparative Example are shown in Table 1 below.

TABLE 1

| Plating conditions | Flatness index | Surface step |
| --- | --- | --- |
| Example 1 | 2.8 | 80 nm |
| Example 2 | 2.8 | 80 nm |
| Example 3 | 2.6 | 100 nm |
| Example 4 | 2.9 | 50 nm |
| Comparative Example | 1.0 | 1300 nm |

It can be seen from Table 1 that in Examples 1 through 4, the fine interconnect trenches 40 and the wider interconnect trench 42 were filled with copper, and the deposited plated copper film 46 is substantially flat without being affected by the shape of the trenches. In Comparative Example, though the fine interconnect trenches 40 are filled with copper, the wider interconnect trench 42 is not filled with copper, and the deposited plated copper film 46 has considerably large steps due to the shape of the trenches.

According to the present invention, a plated film is preferentially deposited in fine interconnect recesses such as trenches and via holes, and the plated film is deposited to a flatter surface without being affected by variations of the shape (sizes or widths differences) of the trenches and the via holes.

What is claimed is:

1. A plating method comprising:
   (a) disposing a substrate having fine interconnect recesses such that a conductive layer formed on a surface of the substrate faces an anode;
   (b) disposing a porous member between the substrate and the anode;
   (c) filling a plating solution containing metal ions, a supporting electrolyte, halogen ions, and at least one of an organic sulfur compound, a high polymer compound, and an organic nitrogen compound between the substrate and the anode;
   (d) holding the conductive layer and the porous member in contact with each other and moving the porous member and the substrate, which has the conductive layer formed thereon, relative to each other for a predetermined time without passing an electric current between the conductive layer and the anode so that the conductive layer is in intimate contact with the porous member for a predetermined time, and stopping the movement of the substrate with respect to the porous member;
   (e) passing an electric current between the conductive layer and the anode for predetermined time, and stopping said passing of the electric current between the conductive layer and the anode after said stopping the movement of the substrate with respect to the porous member;
   (f) releasing the porous member from the surface of the substrate, thereby embedding metal in the fine interconnect recesses after said stopping said passing of the electric current between the conductive layer and the anode; and
   (g) repeating (d) through (f).

2. A plating method according to claim 1, wherein the metal ions comprise copper ions, and the copper ions in the plating solution have a concentration ranging from 30 to 60 g/L.

3. A plating method according to claim 1, wherein the supporting electrolyte comprises sulfuric acid, and the sulfuric acid in the plating solution has a concentration ranging from 10 to 100 g/L.

4. A plating method according to claim 1, wherein the halogen ions comprise chloride ions, and the chloride ions in the plating solution have a concentration ranging from 30 to 90 mg/L.

5. A plating method according to claim 1, wherein the organic sulfur compound contained in the plating solution has a concentration ranging from 0.1 to 100 ppm.

6. A plating method according to claim 1, wherein the high polymer compound has a propylene oxide group or a propylene oxide group and an ethylene oxide group, and is contained in the plating solution at a concentration ranging from 10 to 500 mg/L.

7. A plating method according to claim 1, wherein the organic nitrogen compound is contained in the plating solution at a concentration ranging from 0.01 to 100 g/L.

8. A plating method according to claim 1, wherein the electric current is passed between the conductive layer and the anode at a current density ranging from 1 to 50 mA/cm² for a period of time ranging from 0.1 to 100 seconds, and after the supply of the electric current between the conductive layer and the anode is stopped, the conductive layer is released from the porous member for a period of time ranging from 0.1 to 100 seconds.

9. A plating method according to claim 8, wherein the current density of the electric current, which is passed between the conductive layer and the anode, increases with time.

10. A plating method comprising:
(a) disposing a substrate having fine interconnect recesses such that a conductive layer formed on a surface of the substrate faces an anode;
(b) disposing a porous member between the substrate and the anode;
(c) filling a plating solution containing metal ions, a supporting electrolyte, halogen ions, and at least one of an organic sulfur compound, a high polymer compound, and an organic nitrogen compound between the substrate and the anode;
(d) holding the conductive layer and the porous member in contact with each other and moving the porous member and the substrate, which has the conductive layer formed thereon, relative to each other for a predetermined time without passing an electric current between the conductive layer and the anode so that the conductive layer is in intimate contact with the porous member for a predetermined time, and stopping the movement of the substrate with respect to the porous member;
(e) releasing the porous member from the surface of the substrate after said stopping the movement of the substrate with respect to the porous member;
(f) passing an electric current between the conductive layer and the anode for a predetermined time, and stopping said passing of the electric current between the conductive layer and the anode, thereby embedding metal in the fine interconnect recesses after said releasing the porous member from the surface of the substrate; and
(g) repeating (d) through (f).

11. A plating method according to claim 10, wherein the metal ions comprise copper ions, and the copper ions in the plating solution have a concentration ranging from 30 to 60 g/L.

12. A plating method according to claim 10, wherein the supporting electrolyte comprises sulfuric acid, and the sulfuric acid in the plating solution has a concentration ranging from 10 to 100 g/L.

13. A plating method according to claim 10, wherein the halogen ions comprise chloride ions, and the chloride ions in the plating solution have a concentration ranging from 30 to 90 mg/L.

14. A plating method according to claim 10, wherein the organic sulfur compound contained in the plating solution has a concentration ranging from 0.1 to 100 ppm.

15. A plating method according to claim 10, wherein the high polymer compound has a propylene oxide group or a propylene oxide group and an ethylene oxide group, and is contained in the plating solution at a concentration ranging from 10 to 500 mg/L.

16. A plating method according to claim 10, wherein the organic nitrogen compound is contained in the plating solution at a concentration ranging from 0.01 to 100.

* * * * *